US011073757B2

(12) United States Patent
Kim et al.

(10) Patent No.: US 11,073,757 B2
(45) Date of Patent: Jul. 27, 2021

(54) METHODS OF MANUFACTURING PELLICLE ASSEMBLY AND PHOTOMASK ASSEMBLY

(71) Applicants: Samsung Electronics Co., Ltd., Suwon-si (KR); Research & Business Foundation SUNGKYUNKWAN UNIVERSITY, Suwon-si (KR)

(72) Inventors: Mun Ja Kim, Hwaseong (KR); Seulgi Kim, Hwaseong (KR); Kibong Nam, Suwon (KR); Jinho Yeo, Suwon (KR); Jibeom Yoo, Seoul (KR)

(73) Assignees: Samsung Electronics Co., Ltd.; Research & Business Foundation SUNGKYUNKWAN UNIVERSITY

( * ) Notice: Subject to any disclaimer, the term of this patent is extended or adjusted under 35 U.S.C. 154(b) by 167 days.

(21) Appl. No.: 16/598,180

(22) Filed: Oct. 10, 2019

(65) Prior Publication Data
US 2020/0341364 A1    Oct. 29, 2020

(30) Foreign Application Priority Data

Apr. 24, 2019    (KR) .................. 10-2019-0048028

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC ............................................................. 430/5
See application file for complete search history.

(56) References Cited

U.S. PATENT DOCUMENTS

| | | | |
|---|---|---|---|
| 4,895,727 A | 1/1990 | Allen | |
| 5,446,025 A | 8/1995 | Lu et al. | |
| 5,498,407 A | 3/1996 | Atlas | |
| 5,556,652 A | 9/1996 | Cherukuri et al. | |
| 5,585,090 A | 12/1996 | Yoshioka et al. | |
| 5,643,949 A | 7/1997 | Van Scott et al. | |
| 5,711,955 A | 1/1998 | Karg | |
| 5,750,129 A | 5/1998 | Wakarchuk | |
| 5,766,839 A | 6/1998 | Johnson et al. | |
| 5,948,423 A | 9/1999 | Karg | |
| 6,080,415 A | 6/2000 | Simon | |
| 6,126,948 A | 10/2000 | Simonnet et al. | |
| 6,210,672 B1 | 4/2001 | Cowing | |
| 6,296,866 B2 | 10/2001 | Karg | |
| 6,528,081 B1 | 3/2003 | Zellner | |
| 6,653,252 B2 | 11/2003 | Kawahara | |
| 6,769,428 B2 | 8/2004 | Cronk et al. | |
| 6,783,711 B2 | 8/2004 | Kurth et al. | |
| 6,814,959 B1 | 11/2004 | Mueller et al. | |
| 7,115,275 B2 | 10/2006 | Clarot et al. | |
| 7,179,849 B2 | 2/2007 | Terry | |
| 7,402,300 B2 | 7/2008 | Candau | |
| 7,612,045 B2 | 11/2009 | Eldridge | |
| 7,709,632 B2 | 5/2010 | Johnson et al. | |
| 7,714,011 B2 | 5/2010 | Clarot et al. | |
| 7,959,958 B2 | 6/2011 | Furrer et al. | |
| 7,978,083 B2 | 7/2011 | Melker et al. | |
| 7,980,247 B2 | 7/2011 | Boehm et al. | |
| 8,006,698 B2 | 8/2011 | Boehm et al. | |
| 8,377,422 B2 | 2/2013 | Furrer et al. | |
| 8,486,459 B2 | 7/2013 | Colson | |
| 8,557,226 B2 | 10/2013 | Musa et al. | |
| 8,664,261 B2 | 3/2014 | Furrer | |
| 8,673,272 B2 | 3/2014 | Shih et al. | |
| 8,753,468 B2 | 6/2014 | Caldwell et al. | |
| 8,808,810 B2 | 8/2014 | Veerasamy | |
| 8,871,707 B2 | 10/2014 | Jimenez et al. | |
| 9,044,467 B2 | 6/2015 | Yeh et al. | |
| 9,101,143 B2 | 8/2015 | Markus et al. | |
| 9,416,317 B2 | 8/2016 | Choi et al. | |
| 9,539,296 B2 | 1/2017 | Wei | |
| 9,549,560 B2 | 1/2017 | Walsh et al. | |
| 9,615,576 B2 | 4/2017 | Hunter et al. | |
| 9,622,477 B2 | 4/2017 | Lo et al. | |
| 9,629,363 B2 | 4/2017 | Lo et al. | |
| 9,629,369 B2 | 4/2017 | Lo et al. | |
| 9,630,151 B2 | 4/2017 | Aamer et al. | |
| 9,630,910 B2 | 4/2017 | Lo et al. | |
| 9,635,859 B2 | 5/2017 | Lo et al. | |
| 9,655,365 B2 | 5/2017 | Niyaz et al. | |
| 9,708,288 B2 | 7/2017 | Buysse et al. | |
| 9,759,732 B2 | 9/2017 | Grabert et al. | |
| 9,799,907 B2 | 10/2017 | Kocherginsky | |
| 9,861,940 B2 | 1/2018 | Koehler et al. | |
| 10,058,531 B1 | 8/2018 | Chistov | |
| 2012/0261644 A1 | 10/2012 | Dimitrakopoulos | |
| 2018/0251377 A1 | 9/2018 | Derby et al. | |

FOREIGN PATENT DOCUMENTS

| | | |
|---|---|---|
| CN | 106904605 | 6/2017 |
| CN | 107857251 | 3/2018 |
| CN | 107857252 | 3/2018 |

OTHER PUBLICATIONS

Wang et al, Camphor-Enabled Transfer and Mechanical Testing of Centimeter-Scale Ultrathin Films, Advanced Materials, 2018, article No. 1800688, pp. 1-8.

*Primary Examiner* — Christopher G Young
(74) *Attorney, Agent, or Firm* — Myers Bigel, P.A.

(57) ABSTRACT

Methods of manufacturing a pellicle assembly may include forming a sublimable support layer on a first surface of a pellicle membrane, attaching a pellicle frame to a second surface of the pellicle membrane while the sublimable support layer is on the first surface of the pellicle membrane, and sublimating the sublimable support layer while the pellicle frame is attached to the pellicle membrane. In order to manufacture a photomask assembly, a photomask is fixed to the pellicle frame such that the photomask faces the pellicle membrane with the pellicle frame therebetween.

20 Claims, 18 Drawing Sheets

METHODS OF MANUFACTURING PELLICLE ASSEMBLY AND PHOTOMASK ASSEMBLY

CROSS-REFERENCE TO RELATED APPLICATION

This U.S. non-provisional patent application claims priority under 35 U.S.C. § 119 to Korean Patent Application No. 10-2019-0048028, filed on Apr. 24, 2019, in the Korean Intellectual Property Office, the disclosure of which is incorporated herein in its entirety by reference.

BACKGROUND

The inventive concept relates to a method of manufacturing an integrated circuit device, and more particularly, to a method of manufacturing a pellicle assembly for an exposure apparatus for manufacturing integrated circuit devices and a method of manufacturing a photomask assembly including the pellicle assembly.

In a manufacturing process of an integrated circuit device, a lithography process is used to form circuit patterns on a wafer. In the lithography process, a photomask is used to transfer a pattern onto a substrate (e.g., wafer). When the photomask is contaminated by contaminants (e.g., particles) from a surrounding environment or deformed, defects may occur on the substrate onto which the pattern of the photomask is transported. Therefore, developing a system that may protect the photomask for the lithography process from contamination or deformation may be beneficial and may improve productivity of manufacturing processes.

SUMMARY

The inventive concept provides a method of manufacturing a pellicle assembly capable of ensuring ease of handling of a very thin pellicle membrane that is difficult to handle alone and capable of reducing or minimizing damage and stress to the pellicle membrane when the very thin pellicle membrane is flatly bonded onto a large pellicle frame in a free-standing structure for application to a photomask having a relatively large size.

The inventive concept also provides a method of manufacturing a photomask assembly including a pellicle assembly in which a very thin pellicle membrane is flatly bonded onto a relatively large sized pellicle frame in a free standing structure.

According to the inventive concept, there is provided a method of manufacturing a pellicle assembly in which a sublimable support layer is formed on a first surface of a pellicle membrane. A pellicle frame is attached to a second surface, which is an opposite surface of the first surface of the pellicle membrane, while the sublimable support layer is on the first surface of the pellicle frame. The sublimable support layer is sublimated while the pellicle frame is attached to the pellicle membrane to remove the sublimable support layer from the pellicle membrane.

According to the inventive concept, there is provided a method of manufacturing a pellicle assembly in which a pellicle membrane comprising an edge region and a center region surrounded by the edge region is formed on a metal-containing thin film. A sublimable support layer having different thicknesses on the edge region and on the center region of the pellicle membrane is formed on the first surface of the pellicle membrane. The metal-containing thin film is removed from the pellicle membrane. A pellicle frame is attached to the edge region on a second surface of the pellicle membrane, the second surface being opposite to the first surface of the pellicle membrane. The sublimable support layer is sublimated while the pellicle frame is attached to the pellicle membrane.

According to the inventive concept, there is provided a method of manufacturing a photomask assembly in which a sublimable support structure including a sublimable material is formed on a first surface of a pellicle membrane. A pellicle frame is attached to a second surface, which is an opposite surface of the first surface of the pellicle membrane, while the sublimable support structure is on the first surface of the pellicle membrane. The first surface of the pellicle membrane is exposed by sublimating the sublimable material from the sublimable support structure. A photomask is fixed to the pellicle frame, the photomask faces the pellicle membrane with the pellicle frame therebetween.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
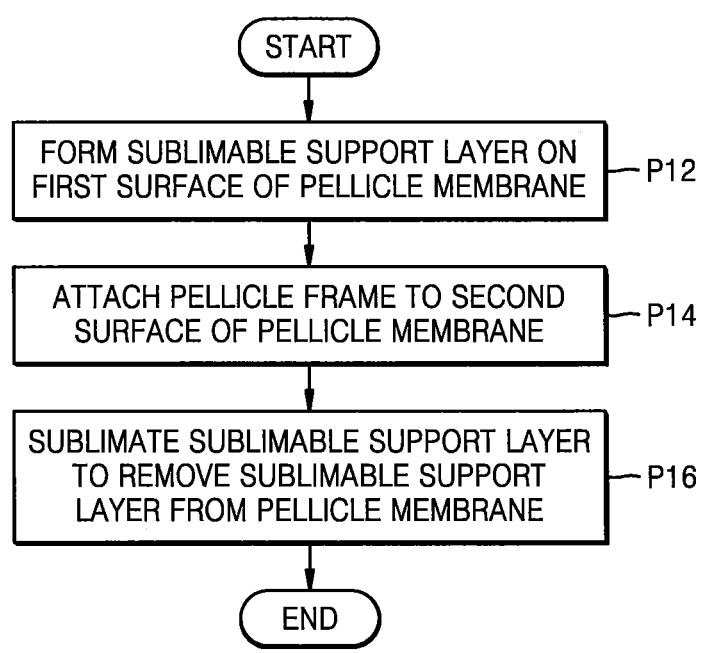
FIG. 1 is a flowchart illustrating a method of manufacturing a pellicle assembly, according to some embodiments of the inventive concept.

Hereinafter, example embodiments of the inventive concept will be described in detail with reference to the accompanying drawings. Like reference numerals in the drawings denote like elements, and thus their description may not be repeatedly provided.

FIG. 1 is a flowchart illustrating a method of manufacturing a pellicle assembly, according to some embodiments of the inventive concept.

Figure 2A:
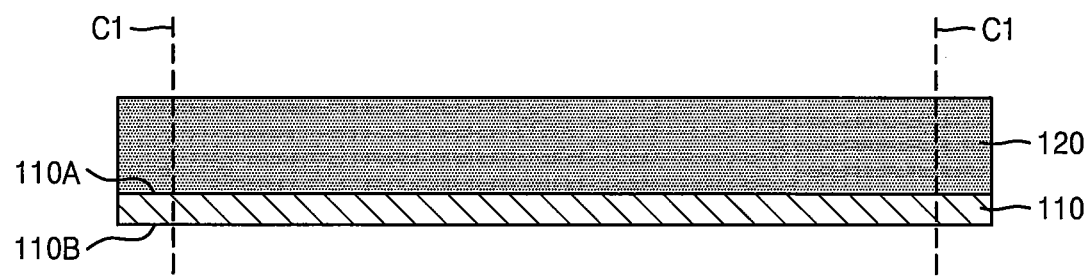
FIGS. 2A to 2C are cross-sectional views illustrating a method of manufacturing a pellicle assembly, according to some embodiments of the inventive concept.
Figure 2B:
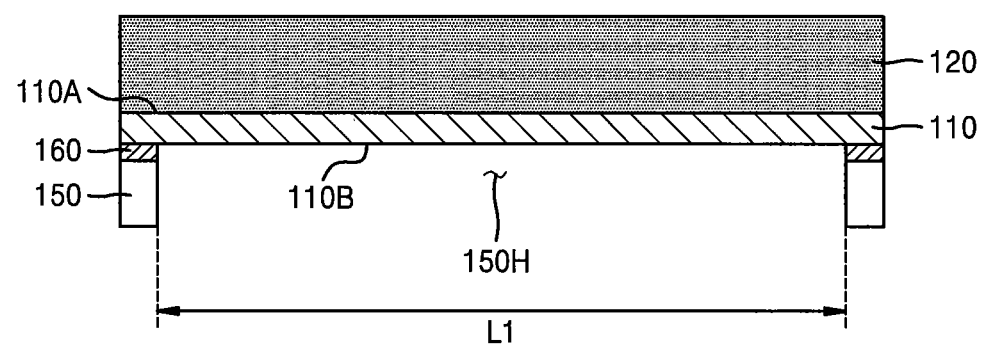
Figure 2C:
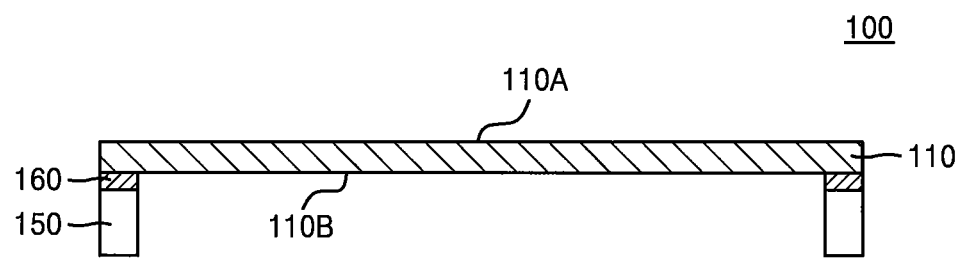

FIGS. 2A to 2C are cross-sectional views illustrating example processes according to a method of manufacturing the pellicle assembly shown in FIG. 1, in a process sequence.

Referring to FIGS. 1 and 2A, in operation P12, a sublimable support layer 120 is formed on a first surface 110A of the pellicle membrane 110.

In some embodiments, the pellicle membrane 110 may include a carbon-containing thin film. The carbon-containing thin film may include graphene, graphite, or a carbon nanotube. The carbon nanotube may include a single wall carbon nanotube (SWCNT), a multiwall CNT (MWCNT), or a combination thereof. When the carbon-containing thin film includes graphene, the carbon-containing thin film may include about 1 to about 60 graphene layers including flat sheets of carbon atoms constituting a honeycomb crystal lattice.

In some embodiments, the pellicle membrane 110 may include the carbon-containing thin film and an enhancement layer coated on a surface of the carbon-containing thin film. The enhancement layer may include a boron (B)-containing material, a silicon (Si)-containing material, or a transition metal. The B-containing material may include B, $B_4C$, boron oxide, boron nitride, or a combination thereof. The Si-containing material may include silicon oxide, silicon nitride, silicon oxynitride, or a combination thereof. The transition metal may include ruthenium (Ru), zirconium (Zr), molybdenum (Mo), or a combination thereof. In some embodiments, the pellicle membrane 110 may have a thickness of about 1 nm to about 200 nm.

The sublimable support layer 120 may include a sublimation material including a hydrocarbon compound or a sublimation material including an inorganic material. The sublimable support layer 120 may be a solid. As used herein, the term "sublimable material" refers to a material that may transition from a solid to gas at room temperature or above. As used herein, the term "room temperature" is from about 18° C. to about 28° C. and may vary from season to season.

In some embodiments, the sublimable material that constitutes the sublimable support layer 120 may include a hydrocarbon compound. The hydrocarbon compound constituting the sublimable support layer 120 may include camphor, camphene, menthol (2-isopropyl-5-methylcyclohexanol), thymol, naphthalene, 1,7-naphthalenediol, ferrocene (bis (cyclopentadienyl) iron), toluene, bromo-nitrobenzene, paradichlorobenzene (1,4-dichlorobenzene), 2-diazo-5,5-dimethylcyclohexane-1,3-dione, borneol (1,7,7-trimethylbicyclo [2.2.1] heptan-2-ol), butyramide, valeramide (pentanamide), 4-tert-butylphenol, furan-2-carboxylic acid, succinic anhydride, 1-adamantanol, 2-adamantanone, adamantine, endo-trimethylenenorbornane, cyclododecane, trimethylnorbornane, norbornane, dimethyl fumarate, benzoic acid, tri-oxymethylene, coumarin (1-benzopyran-2-one), caprolactam, 1,4-cyclohexanediol, phthalide (isobenzofuran-1(3H)-one), lactide, triisopropyltrioxane, or a combination thereof.

In some embodiments, the sublimable material constituting the sublimable support layer 120 may include an inorganic material. The inorganic material may include iodine, ammonium fluorosilicate $((NH_4)_2SiF_6)$, or a combination thereof.

In some embodiments, the sublimable support layer 120 may include a sublimable material that may be sublimated at or above a selected temperature ranging from about 18° C. to about 400° C. For example, the sublimable support layer 120 may include a sublimable material that may be sublimated at a temperature ranging from about 18° C. to about 80° C., ranging from about 18° C. to about 65° C., or ranging from about 18° C. to about 40° C. In some embodiments, the sublimable support layer 120 may include a sublimable material that may be sublimated at room temperature. However, a sublimation temperature of the sublimable material constituting the sublimable support layer 120 is not limited to the above-exemplified temperature ranges and may be higher or lower than the sublimation temperatures provided above. In some embodiments, the sublimable material that constitutes the sublimable support layer 120 may remain solid prior to initiation of a sublimation process.

In some embodiments, a vapor deposition method of supplying a gaseous sublimable material onto the first surface 110A of the pellicle membrane 110 to form the sublimation support layer 120 on the first surface 110A of the pellicle membrane 110 may be used. In some embodiments, a liquid coating method of supplying (e.g., coating) a liquid sublimable material onto the first surface 110A of the pellicle membrane 110 to form the sublimation support layer 120 on the first surface 110A of the pellicle membrane 110 may be used.

Figure 3:
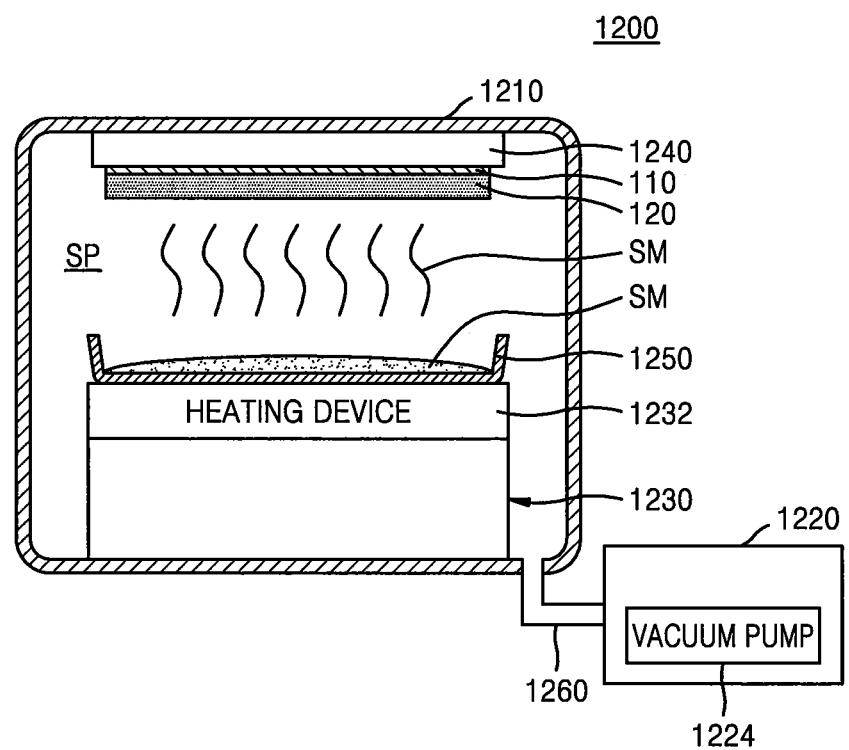
FIG. 3 is a configuration diagram of an example vacuum deposition apparatus that may be used to form a sublimable support layer on a pellicle membrane according to a method of manufacturing a pellicle assembly according to some embodiments of the inventive concept.

FIG. 3 is a schematic configuration diagram of an example vacuum deposition apparatus that may be used to form the sublimable support layer 120 on the pellicle membrane 110 using a vapor deposition method.

Referring to FIG. 3, a vacuum deposition apparatus 1200 may include a chamber 1210 for providing an enclosed space SP, an exhaust device 1220 for exhausting the inside of the chamber 1210, a support 1230 installed in the chamber 1210, a heating device 1232 on the support 1230, and a fixing device 1240 for fixing the pellicle membrane 110 in the chamber 1210. The exhaust device 1220 may include a vacuum pump 1224. The heating device 1232 may include a heater plate or a heating lamp. A plate 1250 capable of receiving a sublimable material SM may be placed on the heating device 1232. The heating device 1232 may heat the plate 1250 such that the sublimable material SM received in the plate 1250 may be sublimated.

Figure 10A:
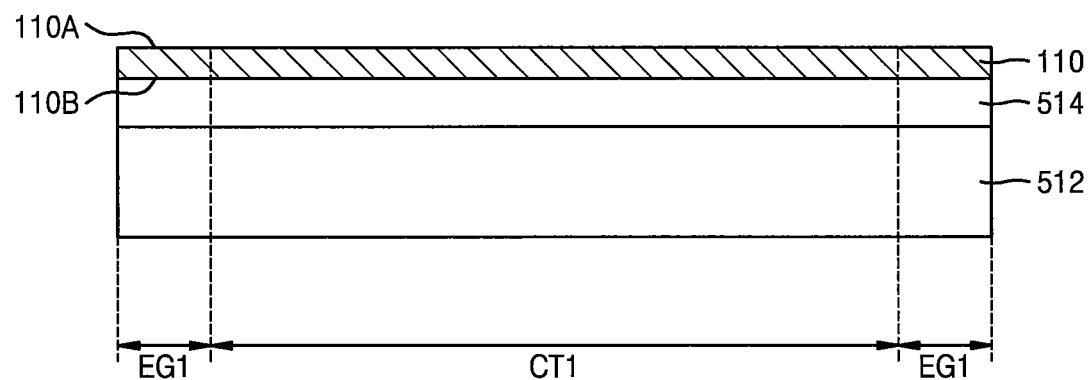
FIGS. 10A to 10D are cross-sectional views illustrating a method of manufacturing a pellicle assembly, according to some embodiments of the inventive concept.

The fixing device 1240 may fix the pellicle membrane 110 in the chamber 1210 to face the sublimable material received in the plate 1250 in a non-contact manner. The fixing device 1240 may include a fixing member (not shown) for fixing the pellicle membrane 110. In some embodiments, the pellicle membrane 110 may be fixed to the fixing device 1240 while being supported by a support (not shown). The support may include a support substrate 512, a metal-containing thin film 514, or a combination thereof as illustrated in FIG. 10A.

In some embodiments, while forming the sublimable support layer 120 on the pellicle membrane 110 using vapor deposition, the heating device 1232 may heat the sublimable material SM from a first initial temperature to a second temperature that is at or above a sublimation point of the sublimable material SM. The heating device 1232 may heat the sublimable material SM received in the plate 1250 for a predetermined time at a predetermined temperature. The enclosed space SP inside the chamber 1210 may be maintained at a predetermined pressure within the range of about 0.1 Torr to about 760 Torr using the exhaust device 1220.

Vapor deposition conditions for forming the sublimable support layer 120 may be variously selected depending on the type of the sublimable material SM, the thickness of the sublimable support layer 120 to be formed, and the like. In some embodiments, during vapor deposition, the sublimable material SM received in the plate 1250 is evaporated using the heating device 1232 at a selected temperature ranging from about 60° C. to about 400° C. and the evaporated sublimable material SM may condense on a surface of the pellicle membrane 110 fixed to the fixing device 1240. Pressure of the vapor deposition process may be selected within the range of about 0.1 Torr to about 760 Torr. The vapor deposition process may be performed for about 1 minute to about 2 hours.

After the sublimable support layer 120 having a desired thickness is formed on the pellicle membrane 110, the pellicle membrane 110 may be removed from the vacuum deposition apparatus 1200 and may be cooled to room temperature or to temperature lower than a sublimation temperature of the sublimable material SM.

In some embodiments, the atmosphere of the enclosed space SP in the chamber 1210 may be exhausted through the exhaust pipe 1260 installed below the chamber 1210. The inside of the chamber 1210 may be decompressed by discharging the atmosphere of the enclosed space SP through the exhaust pipe 1260 by using the exhaust device 1220. In some embodiments, the density of the sublimable support layer 120 may be adjusted by controlling pressure in the vapor deposition process using the vacuum deposition apparatus 1200 by using the vacuum pump 1224. The lower the pressure in the vapor deposition process, the greater the density of the sublimable support layer 120 may be. A thickness of the sublimable support layer 120 may be adjusted by the vapor deposition time. The longer the vapor deposition time, the greater the thickness of the sublimable support layer 120 may be.

In some embodiments, the vacuum deposition apparatus 1200 may be used to form the sublimable support layer 120 including camphor. For example, the sublimable support layer 120 including camphor may be formed on a surface of the pellicle membrane 110 with a thickness of about 50 µm to about 500 µm by setting the temperature of the heating device 1232 at about 50° C. to about 200° C., maintaining the pressure of the enclosed space SP at about 25 Torr to about 760 Torr, and evaporating camphor received in the plate 1250 for about 1 minute to about 2 hours and condensing the vaporized camphor on the surface of the pellicle membrane 110. In some embodiments, camphor is vaporized for about 12 minutes using the vacuum deposition apparatus 1200 at a temperature of about 160° C. and a pressure of about 760 Torr to obtain a camphor support membrane having a thickness of about 200 µm on the pellicle membrane 110.

In some embodiments, a liquid coating method may be used to form the sublimable support layer 120. For example, naphthalene is dissolved in an oven maintained at a temperature of about 110° C. to form liquid naphthalene. The liquid naphthalene is coated on the pellicle membrane 110 and cooled to form the sublimable support layer 120 made of a naphthalene film in a solid state. Cold water may be used to cool the liquid naphthalene-coated pellicle membrane 110, but the inventive concept is not limited thereto.

When the pellicle membrane 110 has a thickness of a few tens of nm, for example, from about 10 nm to about 40 nm, the sublimable support layer 120 having a thickness from about 50 µm to about 500 µm is formed on the pellicle membrane 110 to provide a thickness gain derived from the sublimable support layer 120 and thus the pellicle membrane 110 covered with the sublimable support layer 120 may be easily transported and handled. Therefore, by using the sublimable support layer 120, the pellicle membrane 110 may be easily processed in a free-standing structure without any deformation such as physical damage, bending, sagging, etc. of the pellicle membrane 110.

Referring again to FIGS. 1 and 2A, a resultant product having the sublimable support layer 120 formed on the first surface 110A of the pellicle membrane 110 may be processed to a desired size. To this end, the resultant product having the pellicle membrane 110 covered with the sublimable support layer 120 may be cut along a cutting line C1. After cutting the pellicle membrane 110 and the sublimable support layer 120, each of the pellicle membrane 110 and the sublimable support layer 120 may have a planar size greater than that of an opening 150H (see FIG. 2B) formed in the center of a pellicle frame 150 to be attached to the pellicle membrane 110 in a subsequent process. In some embodiments, the cutting process along the cutting line C1 of the pellicle membrane 110 and the sublimable support layer 120 may be omitted.

Referring to FIGS. 1 and 2B, in operation P14, the pellicle frame 150 is attached to a second surface 110B of the pellicle membrane 110 with the sublimable support layer 120 covering the first surface 110A of the pellicle membrane 110.

The process of attaching the pellicle frame 150 onto the second surface 110B of the pellicle membrane 110 may be performed by an operator's manual operation or an automated process using a machine. An adhesive layer 160 may be used to attach the pellicle frame 150 onto the second surface 110B of the pellicle membrane 110.

In some embodiments, in order to attach the pellicle frame 150 onto the second surface 110B of the pellicle membrane 110, a container containing liquid such as deionized water (DIW) may be prepared. Thereafter, the second surface 110B of the pellicle membrane 110 may be attached to the adhesive layer 160 of the pellicle frame 150 by floating a stack structure of the pellicle membrane 110 and the sublimable support layer 120 on liquid in the container such that the second surface 110B of the pellicle membrane 110 faces the liquid with the sublimable support layer 120 covering the first surface 110A of the pellicle membrane 110, and by raising the pellicle frame 150 to which the adhesive layer 160 is adhered from the inside of the liquid toward the pellicle membrane 110. In some embodiments, the second surface 110B and the pellicle frame 150 may be brought into direct contact by using Van der Waals force between the second surface 110B of the pellicle membrane 110 and the pellicle frame 150 without using the adhesive layer 160 for attaching the pellicle frame 150 to the second surface 110B of the pellicle membrane 110.

The pellicle frame 150 may have a polygonal or circular ring shape. The opening 150H of the pellicle frame 150 may have a width L1 of about 50 mm to about 150 mm. In some embodiments, the opening 150H may be a square of about 50 mm×about 50 mm, a rectangle of about 50 mm×about 80 mm, or a rectangle of about 110 mm×about 140 mm. However, the size and shape of the opening 150H are not limited thereto. A planar shape of the pellicle frame 150 and the opening 150H may have various planar shapes depending on the purpose. For example, the pellicle frame 150 and the opening 150H may have various planar shapes such as a triangle, a square, a hexagon, an octagon, and the like.

Each of the pellicle membrane 110 and the sublimable support layer 120 may have a planar size greater than that of the opening 150H of the pellicle frame 150. In some embodiments, each of the pellicle membrane 110 and the sublimable support layer 120 may have a planar size of about 60 mm×about 60 mm, about 60 mm×about 90 mm, or about 120 mm×about 150 mm. However, the inventive concept is not limited thereto.

The pellicle frame 150 may include metal or polymer. For example, the pellicle frame 150 may include carbon, diamond like carbon (DLC), aluminum, stainless steel, or polyethylene. The adhesive layer 160 may include an adhesive such as an acrylic resin, an epoxy resin, or a fluorine resin. A thickness of the adhesive layer 160 may be selected within the range of about 1 nm to about 10 nm.

Referring to FIGS. 1 and 2C, in operation P16, the sublimable support layer 120 is sublimated from the resultant product of FIG. 2B to remove the sublimable support layer 120 from the pellicle membrane 110 to form a pellicle assembly 100. The first surface 110A of the pellicle membrane 110 may be exposed in the pellicle assembly 100 as the sublimable support layer 120 sublimes.

In some embodiments, the sublimable support layer 120 may be sublimated at room temperature and atmospheric pressure to remove the sublimable support layer 120 from the pellicle membrane 110. As used herein, the term "atmospheric pressure" is about 760 Torr. In some embodiments, the sublimable support layer 120 may be sublimated under a vacuum atmosphere lower than atmospheric pressure to remove the sublimable support layer 120 from the pellicle membrane 110.

Figure 4:
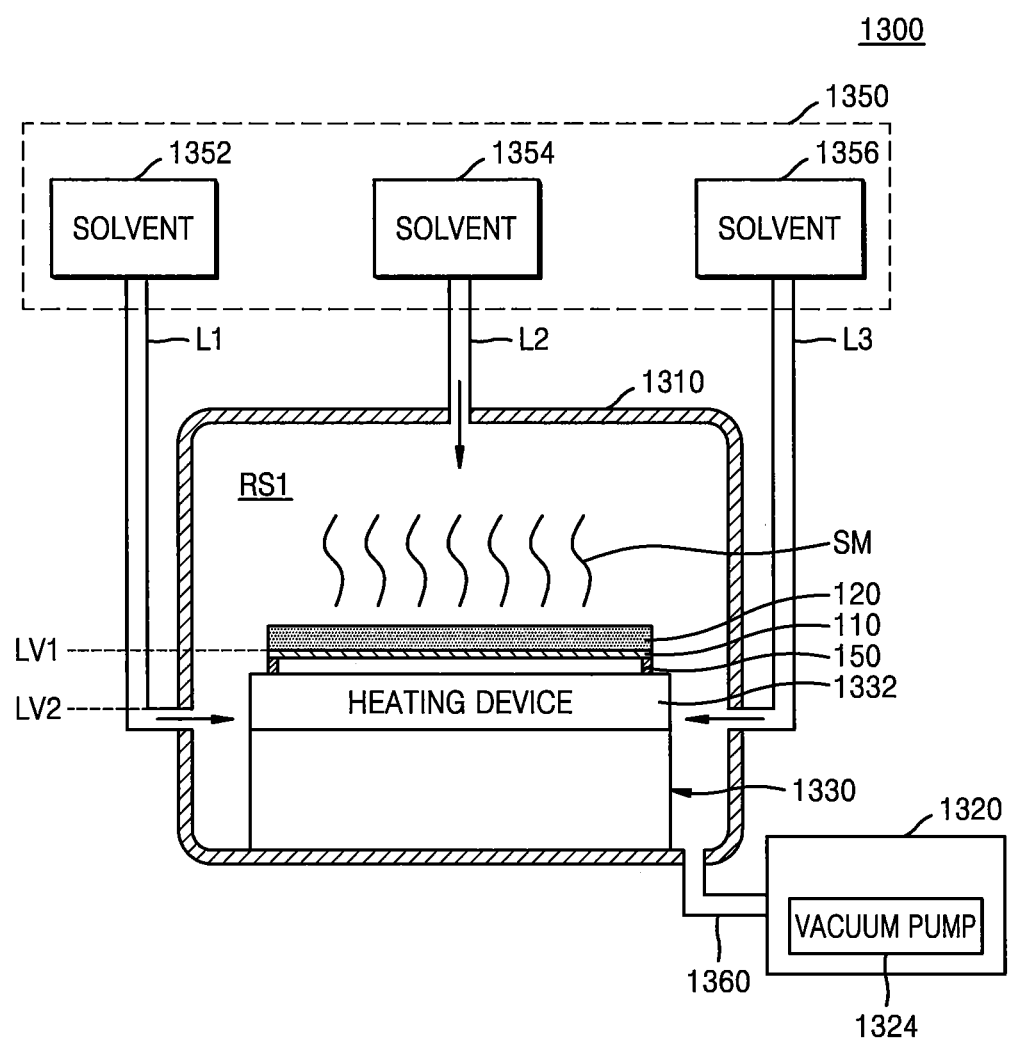
FIG. 4 is a configuration diagram of an example sublimation processing apparatus that may be used to remove a sublimable support layer from a pellicle membrane according to a method of manufacturing a pellicle assembly according to some embodiments of the inventive concept.

FIG. 4 is a schematic configuration diagram of a sublimation processing apparatus 1300 as an example that may be used to remove the sublimable support layer 120 from the pellicle membrane 110.

Referring to FIG. 4, the sublimation processing apparatus 1300 may include a chamber 1310 for providing an enclosed space RS1, an exhaust device 1320 for exhausting the inside of the chamber 1310, a support 1330 installed in the chamber 1310, a heating device 1332 on the support 1330, and a solvent supplier 1350 for supplying a volatile solvent into the chamber 1310. The exhaust device 1320 may include a vacuum pump 1324. The solvent supplier 1350 may supply at least one solvent 1352, 1354, or 1356 into the chamber 1310 through at least one volatile solvent supply line L1, L2, or L3.

The solvents 1352, 1354, and 1356 supplied from the solvent supplier 1350 may be a material capable of dissolving the sublimable material SM constituting the sublimable support layer 120. The solvents 1352, 1354, and 1356 supplied into the chamber 1310 through the solvent supply lines L1, L2, and L3 may be the same material and at least two of the solvents 1352, 1354, and 1356 may be different materials. In some embodiments, each of the solvents 1352, 1354, and 1356 may include alcohol with relatively high volatility. For example, the solvents 1352, 1354, and 1356 may include methanol, ethanol, propanol, or isopropyl alcohol, respectively, but the inventive concept is not limited thereto.

In order to sublimate the sublimable support layer 120 according to operation P16 in FIG. 1 using the sublimation processing apparatus 1300 illustrated in FIG. 4, the heating device 1332 is set to a temperature selected ranging from about 18° C. to about 400° C. Further, a coupling structure of the pellicle membrane 110 and the pellicle frame 150 covered with the sublimable support layer 120 may be maintained for a certain period of time in a state in which the coupling structure is placed on the support 1330. The set temperature of the heating device 1332 may be controlled differently depending on a sublimation point of the sublimable material SM constituting the sublimable support layer 120.

In some embodiments, during sublimation of the sublimable support layer 120 using the sublimation processing apparatus 1300, at least one of the solvents 1352, 1354, and 1356 may be supplied into the chamber 1310 through at least one of the solvent supply lines L1, L2, and L3. The solvents 1352, 1354, and 1356 may be supplied into the chamber 1310 in a gas or liquid state.

Some solvents 1352 and 1356 from among the solvents 1352, 1354, and 1356 may be transported along the solvent supply lines L1 and L3 and supplied into the chamber 1310 at a second level LV2 lower than a first level LV1 at which the sublimable support layer 120 is disposed in the chamber 1310. The solvents 1352 and 1356 supplied to the inside of the chamber 1310 at the second level LV2 may be sublimated by dissolving a sublimable material constituting the sublimable support layer 120 while being volatilized along a path to an upper level higher than the second level LV2 in the enclosed space RS1.

When the solvents 1352, 1354, and 1356 supplied into the chamber 1310 include alcohol, the sublimable support layer 120 may be sublimated under an alcohol atmosphere. The alcohol constituting the solvents 1352, 1354, and 1356 is volatile and may include a material capable of dissolving the sublimable support layer 120. Accordingly, the solvents 1352, 1354, and 1356 including alcohol may serve as sublimation accelerators. The solvents 1352, 1354, and 1356 including alcohol may control a sublimation rate so as to be sublimated at a relatively uniform rate on the entire exposed surface of the sublimable support layer 120. Further, the solvents 1352, 1354, and 1356 may include alcohol having relatively low surface energy. Therefore, even when the surface of the pellicle membrane 110 is exposed to an alcohol atmosphere while the sublimable material SM constituting the sublimable support layer 120 is sublimated, adverse effects such as damage to the surface of the pellicle membrane 110 by the alcohol atmosphere may be minimized.

Valves (not shown) may be respectively installed on the solvent supply lines L1, L2, and L3. During the sublimation of the sublimable support layer 120, the valve may be used to block the supply of the solvents 1352, 1354, and 1356 into the chamber 1310 through the solvent supply lines L1, L2, and L3. In this case, a sublimable material constituting the sublimable support layer 120 may be sublimated only by temperature control without the help of the solvents.

Materials sublimated from the sublimable support layer 120 and volatile solvent may be discharged through an exhaust pipe 1360 installed below the chamber 1310.

Figure 5:
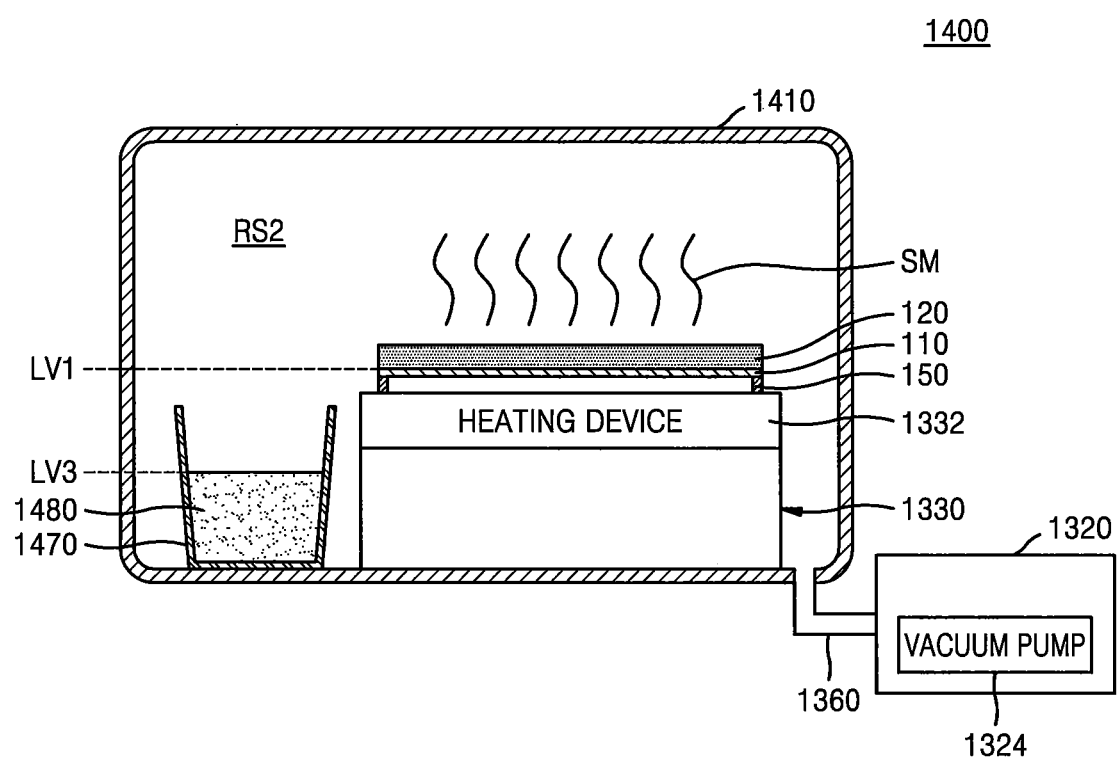
FIG. 5 is a configuration diagram of an example sublimation processing apparatus that may be used to remove a sublimable support layer from a pellicle membrane according to a method of manufacturing a pellicle assembly according to some embodiments of the inventive concept.

FIG. 5 is a schematic configuration diagram of an example sublimation processing apparatus 1400 that may be used to remove the sublimable support layer 120 from the pellicle membrane 110.

Referring to FIG. 5, the sublimation processing apparatus 1400 may include a chamber 1410 which provides an enclosed space RS2. The support 1330 including the heating device 1332 is installed in the chamber 1410 similarly to the sublimation processing apparatus 1300 shown in FIG. 4, and the exhaust device 1320 may be connected to the chamber 1410. However, unlike the sublimation processing apparatus 1300 illustrated in FIG. 4, the solvent supplier 1350 may not be connected to the chamber 1410. In the chamber 1410, a container 1470 capable of receiving a solvent 1480 may be disposed. The solvent 1480 may be a volatile material capable of dissolving the sublimable material SM constituting the sublimable support layer 120. In some embodiments, the solvent 1480 may include methanol, ethanol, propanol, or isopropyl alcohol, but the inventive concept is not limited thereto.

In order to sublimate the sublimable support layer 120 according to operation P16 in FIG. 1 using the sublimation processing apparatus 1400 illustrated in FIG. 5, the heating device 1332 is set to a temperature selected ranging from about 18° C. to about 400° C. Further, a coupling structure of the pellicle membrane 110 and the pellicle frame 150 covered with the sublimable support layer 120 may be maintained for a certain period of time in a state in which the coupling structure is placed on the support 1330. The set temperature of the heating device 1332 may be controlled differently depending on a sublimation point of the sublimable material SM constituting the sublimable support layer 120.

In some embodiments, during the sublimation of the sublimable support layer 120, the solvent 1480 in the container 1470 may be volatilized from a third level LV3, which is lower than the first level LV1 at which the sublimable support layer 120 is disposed, to an upper level higher than the third level LV3 of the enclosed space RS2. The sublimable material constituting the sublimable support layer 120 may be dissolved and sublimated while the solvent 1480 volatilizes and moves from the third level LV3 in the enclosed space RS2. The solvent 1480 may serve as a sublimation accelerator for the sublimable support layer 120 and thus a sublimation rate may be controlled to be sublimated at a relatively uniform rate on the entire exposed surface of the sublimable support layer 120. The solvent 1480 may include alcohol having relatively low surface energy so that adverse effects such as damage to the surface of the pellicle membrane 110 may be minimized even if the surface of the pellicle membrane 110 is exposed to the solvent 1480 which is volatilized.

Materials sublimated from the sublimable support layer 120 and volatile solvent may be discharged through an exhaust pipe 1360 installed below the chamber 1410.

In the sublimation processing apparatus 1400, the solvent 1480 and the container 1470 may be omitted. In this case, the sublimable material constituting the sublimable support layer 120 may be sublimated only by temperature control without the help of the solvent 1480.

In some embodiments, the sublimable support layer 120 (see FIG. 2B) formed on the pellicle membrane 110 may be removed by sublimation under a vacuum atmosphere lower than atmospheric pressure using the sublimation processing apparatus 1300 shown in FIG. 4 or the sublimation processing apparatus 1400 shown in FIG. 5. In some embodiments, the sublimable support layer 120 formed on the pellicle membrane 110 may be removed by sublimation at a temperature higher than room temperature, for example, at a temperature of about 60° C. to about 100° C., in an alcohol environment using the sublimation processing apparatus 1300 illustrated in FIG. 4 or the sublimation processing apparatus 1400 illustrated in FIG. 5. In some embodiments, the sublimable support layer 120 formed on the pellicle membrane 110 may be removed by sublimation at room temperature and atmospheric pressure.

Figure 6:
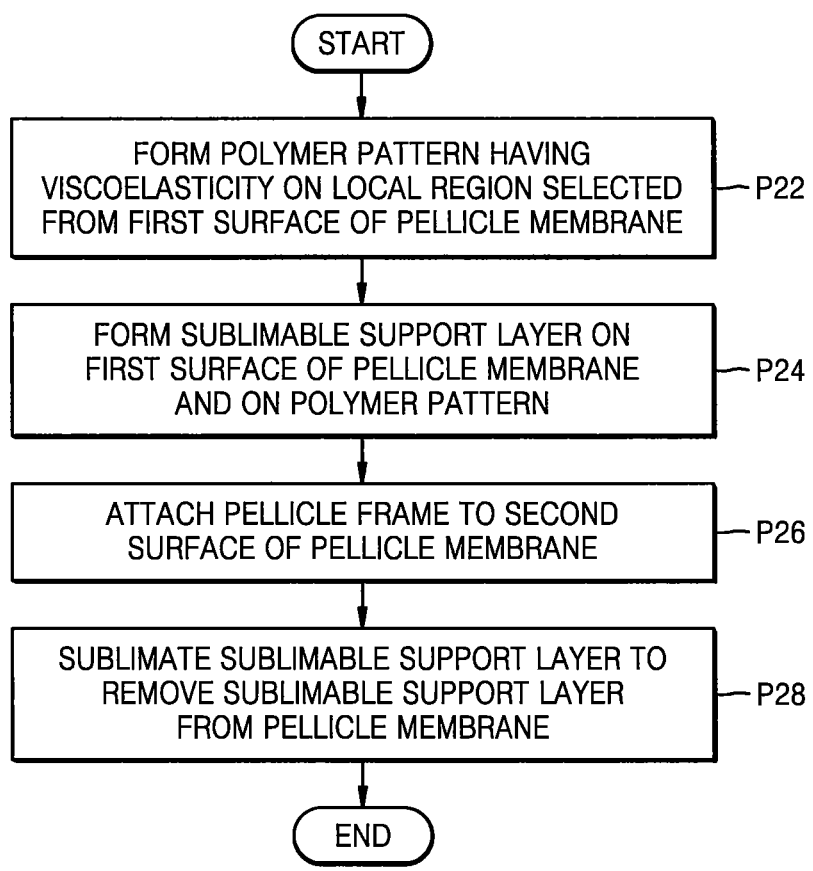
FIG. 6 is a flowchart illustrating a method of manufacturing a pellicle assembly, according to some embodiments of the inventive concept.

FIG. 6 is a flowchart illustrating a method of manufacturing a pellicle assembly, according to some embodiments of the inventive concept.

FIGS. 7A to 7D are cross-sectional views illustrating processes according to a method of manufacturing the pellicle assembly shown in FIG. 6, in a process sequence. In FIGS. 7A to 7D, the same reference numerals as in FIGS. 2A to 2C denote the same elements, and descriptions thereof will not be given herein.

Figure 7A:
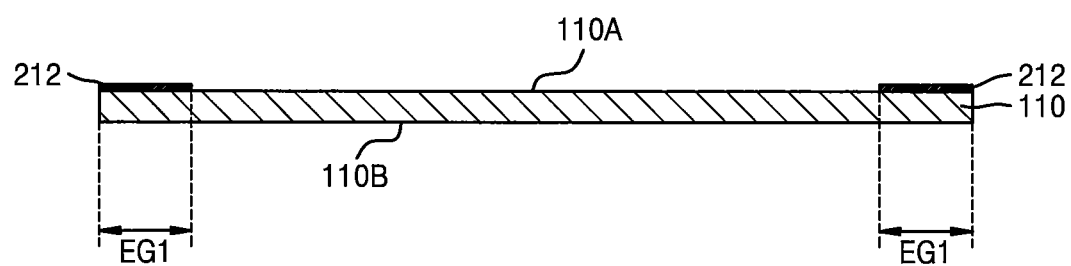
FIGS. 7A to 7D are cross-sectional views illustrating a method of manufacturing a pellicle assembly, according to some embodiments of the inventive concept.

Referring to FIGS. 6 and 7A, in operation P22, a polymer pattern 212 having viscoelasticity is formed on an edge region EG1, which is a local region selected from the first surface 110A of the pellicle membrane 110. The edge region EG1 may be a portion of the first surface 110A of the pellicle membrane 110.

The edge region EG1 of the pellicle membrane 110 may not overlap vertically the opening 150H (see FIG. 7C) of the pellicle frame 150 to be attached to the second surface 110B of the pellicle membrane 110 in a subsequent process. The vertical direction may be a thickness direction of the pellicle membrane 110. A planar shape of the edge region EG1 may be a polygonal or circular ring shape. It will be understood that "an element A not overlapping vertically an element B" (or similar language) as used herein means that no vertical line intersecting both the elements A and B exists.

In some embodiments, the polymer pattern 212 may include polymethylmethacrylate (PMMA), polydimethylsiloxane (PDMS), polydiphenyl siloxane (PDPS), a copolymer containing at least two polymers selected from the above, or a combination thereof. In some embodiments, the polymer pattern 212 may have a thickness selected from within the range of about 1 nm to about 10 nm, but is not limited thereto.

Figure 7B:
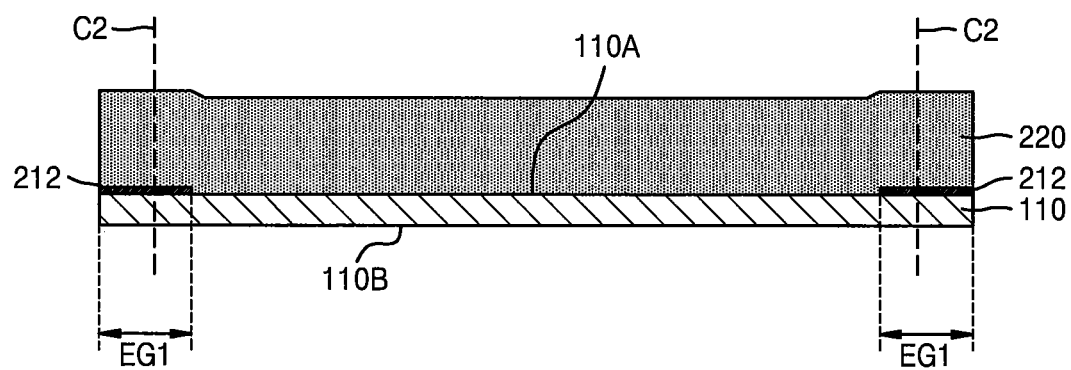

Referring to FIGS. 6 and 7B, in operation P24, similar to the method of manufacturing the sublimable support layer 120 with reference to operation P12 of FIG. 1 and FIG. 2A, a sublimable support layer 220 is formed on the first surface 110A of the pellicle membrane 110 and on the polymer pattern 212.

A more detailed configuration of the sublimable support layer 220 is substantially the same as that described for the sublimable support layer 120 with reference to FIG. 2A. However, the sublimable support layer 220 may be spaced apart from the pellicle membrane 110 by the polymer pattern 212 in the edge region EG1 of the pellicle membrane 110. The polymer pattern 212 may serve as an adhesive layer between the pellicle membrane 110 and the sublimable support layer 220. Thus, during handling of the pellicle membrane 110 covered with the sublimable support layer 220, on the edge region EG1, where adhesion between the pellicle membrane 110 and the sublimable support layer 220 may be comparatively weak, the sublimable support layer 220 may be kept fixed on the pellicle membrane 110 by the polymer pattern 212 without being peeled off.

A resultant product of FIG. 7B in which the sublimable support layer 220 is formed may be processed into a desired size. To this end, the resultant product having the pellicle membrane 110 covered with the sublimable support layer 220 may be cut along a cutting line C2. Here, the polymer pattern 212 may also be cut. In some embodiments, the process of cutting the resultant product having the pellicle membrane 110 covered with the sublimable support layer 220 along the cutting line C2 may be omitted.

Figure 7C:
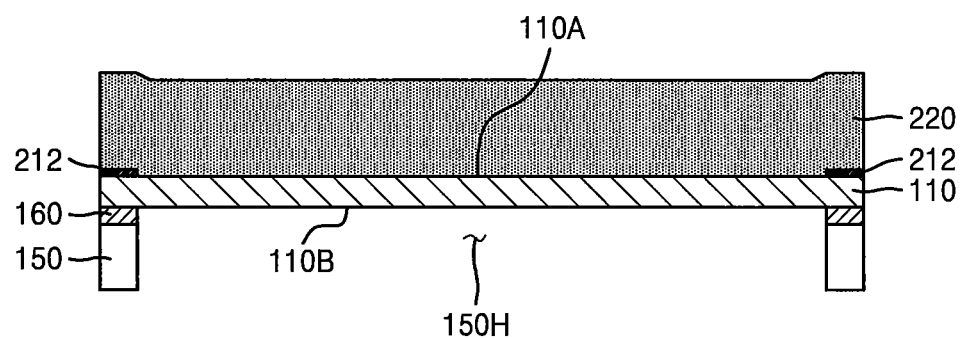

Referring to FIGS. 6 and 7C, in operation P26, the pellicle frame 150 is attached to the second surface 110B of the pellicle membrane 110 in a similar manner to that described with reference to operation P14 of FIG. 1 and FIG. 2B. The polymer pattern 212 remaining on the pellicle membrane 110 may not overlap with the opening 150H of the pellicle frame 150 in a vertical direction, which is a thickness direction of the pellicle membrane 110.

Figure 7D:
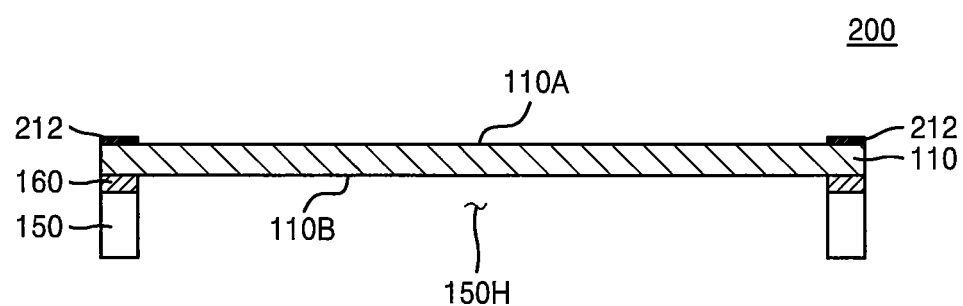

Referring to FIGS. 6 and 7D, in operation P28, the sublimable support layer 220 is removed from the resultant product of FIG. 7C to form a pellicle assembly 200 in a similar manner to that described for removal of the sublimable support layer 120 with reference to operation P16 of FIG. 1 and FIG. 2C.

In the pellicle assembly 200, the first surface 110A of the pellicle membrane 110 may be exposed at a portion of the pellicle membrane 110 that overlaps (e.g., vertically overlaps) the opening 150H of the pellicle frame 150 in the thickness direction of the pellicle membrane 110. The first surface 110A may be covered with the polymer pattern 212 in the edge region EG1 (see FIG. 7B) of the pellicle membrane 110. The polymer pattern 212 may be removed from the pellicle assembly 200, or the polymer pattern 212 may be left on the pellicle membrane 110 as needed.

FIGS. 8A to 8E are cross-sectional views illustrating a method of manufacturing a pellicle assembly, according to some embodiments of the inventive concept, in a process sequence. In FIGS. 8A to 8E, the same reference numerals as in FIGS. 2A to 2C and FIGS. 7A to 7D denote the same elements, and descriptions thereof will not be given herein.

Figure 8A:
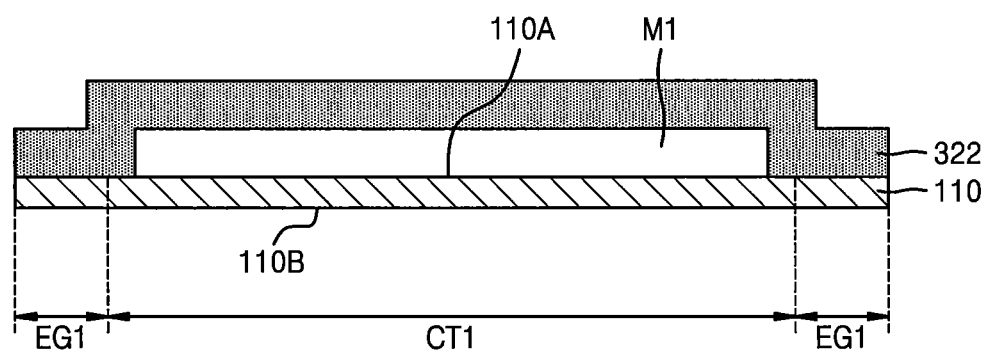
FIGS. 8A to 8E are cross-sectional views illustrating a method of manufacturing a pellicle assembly, according to some embodiments of the inventive concept.

Referring to FIG. 8A, after a mask pattern M1 covering at least a portion of a center region CT1 is formed on the first surface 110A of the pellicle membrane 110 having the edge region EG1 and the center region CT1 surrounded by the edge region EG1, a first sublimable support layer 322 is formed on the first surface 110A exposed around the mask pattern M1 in the same manner as described for the formation of the sublimable support layer 120 with reference to operation P12 of FIG. 1 and FIG. 2A. The first sublimable support layer 322 may also be formed on the mask pattern M1.

The center region CT1 of the pellicle membrane 110 may vertically overlap the opening 150H (see FIG. 8D) of the pellicle frame 150 to be attached to the second surface 110B of the pellicle membrane 110 in a subsequent process. The vertical direction may be a thickness direction of the pellicle membrane 110. A more detailed configuration of the first sublimable support layer 322 is substantially the same as that described for the sublimable support layer 120 with reference to FIG. 2A.

A plane size of the mask pattern M1 may be equal to or less than that of the center region CT1. In some embodiments, the mask pattern M1 may be non-adhesively placed on the first surface 110A of the pellicle membrane 110. There may be no chemical coupling or physical coupling between the mask pattern M1 and the first surface 110A of the pellicle membrane 110. In some embodiments, the mask pattern M1 may include plastic. For example, the mask pattern M1 may include polyethylene terephthalate (PET), polypropylene (PP), polystyrene (PS), polyamide (PA), or a combination thereof, but is not limited thereto.

Figure 8B:
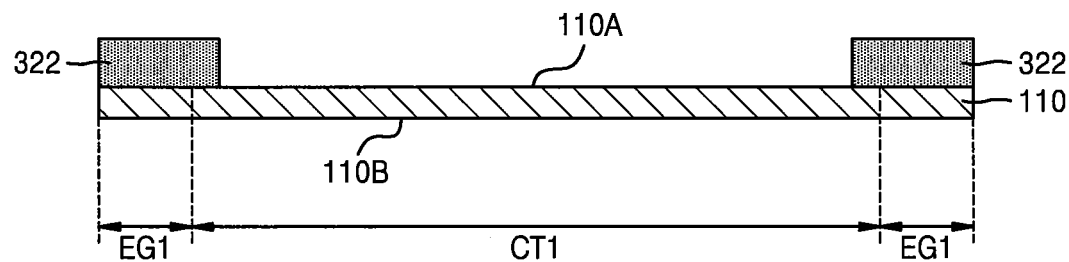

Referring to FIG. 8B, the mask pattern M1 and a portion of the first sublimable support layer 322 covering the mask pattern M1 are removed from a resultant product of FIG. 8A to expose the first surface 110A in the center region CT1 of the pellicle membrane 110. After the mask pattern M1 is removed, a portion of the first sublimable support layer 322 remaining on the pellicle membrane 110 may cover the edge region EG1 of the pellicle membrane 110 but may not cover at least a portion of the center region CT1. Since the mask pattern M1 is lifted from the pellicle membrane 110 to remove the mask pattern M1 and the portion of the first sublimable support layer 322 covering the mask pattern M1, the pellicle membrane 110 is not damaged during removal of the mask pattern M1.

Figure 8C:
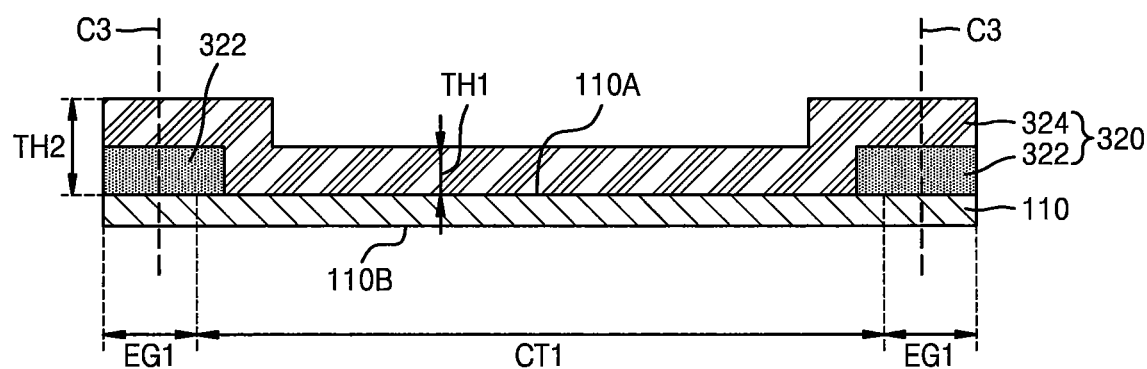

Referring to FIG. 8C, a second sublimable support layer 324 is formed on a resultant product of FIG. 8B. The second sublimable support layer 324 may be formed to cover the first sublimable support layer 322 and the first surface 110A of the center region CT1 that is not covered by the first sublimable support layer 322. The second sublimable support layer 324 may be formed in the same manner as described in connection with the method of forming the sublimable support layer 120 with reference to operation P12 of FIG. 1 and FIG. 2A.

The first sublimable support layer 322 and the second sublimable support layer 324 may constitute a sublimable support layer 320. Since the sublimable support layer 320 on the edge region EG1 of the pellicle membrane 110 has a stack structure of the first sublimable support layer 322 and the second sublimable support layer 324, a thickness TH2 of a portion of the pellicle membrane 110 covering the edge region EG1 may be greater than a thickness TH1 of a portion of the pellicle membrane 110 covering the center region CT1 in the sublimable support layer 320.

In some cases, during handling of the pellicle membrane 110, a portion of the sublimable support layer 320 may be undesirably sublimated. In particular, in an edge portion where an area exposed to the outside of the sublimable support layer 320 is relatively large, volume reduction of the sublimable support layer 320 by undesired sublimation may be greater than in other portions. However, since the thickness TH2 of the sublimable support layer 320 obtained in this example at an edge portion covering the edge region EG1 of the pellicle membrane 110 is greater than at other portions, the sublimable support layer 320 may support the pellicle membrane 110 without problems during handling of the pellicle membrane 110 even when volume reduction is caused by undesired sublimation at the edge of the sublimable support layer 320.

In some embodiments, the first sublimable support layer 322 and the second sublimable support layer 324 may be formed under substantially the same or similar pressure conditions. In this case, the density of the first sublimable support layer 322 and the density of the second sublimable support layer 324 may be substantially the same or similar.

In some embodiments, the first sublimable support layer 322 and the second sublimable support layer 324 may be formed under different pressure conditions. For example, pressure of the process of forming the first sublimable support layer 322 may be lower than pressure of the process of forming the second sublimable support layer 324. In this case, the density of the first sublimable support layer 322 may be greater than the density of the second sublimable support layer 324. Thus, under the same conditions, a sublimation rate of the first sublimable support layer 322 may be lower than a sublimation rate of the second sublimable support layer 324. Thus, volume reduction caused by undesired sublimation at the edge of the sublimable support layer 320 may be minimized.

The resultant product of FIG. 8C in which the sublimable support layer 320 is formed may be processed into a desired size. To this end, the resultant product having the pellicle membrane 110 covered with the sublimable support layer 320 may be cut along a cutting line C3. In some embodiments, the process of cutting the resultant product having the pellicle membrane 110 covered with the sublimable support layer 320 along the cutting line C3 may be omitted.

Figure 8D:
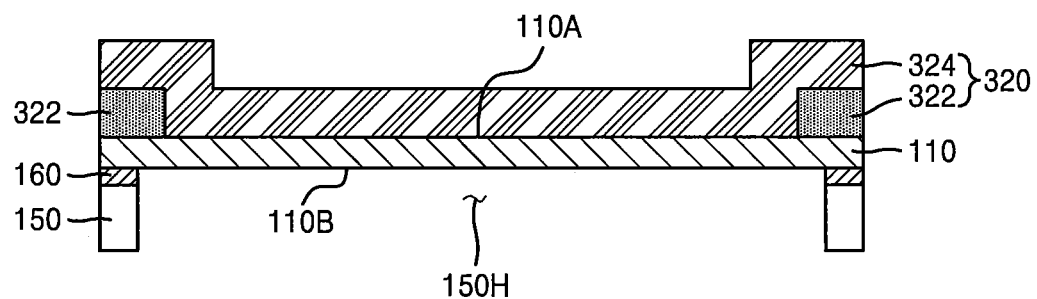

Referring to FIG. 8D, the pellicle frame 150 is attached to the second surface 110B of the pellicle membrane 110 in a similar manner to that described with reference to operation P14 of FIG. 1 and FIG. 2B.

Figure 8E:
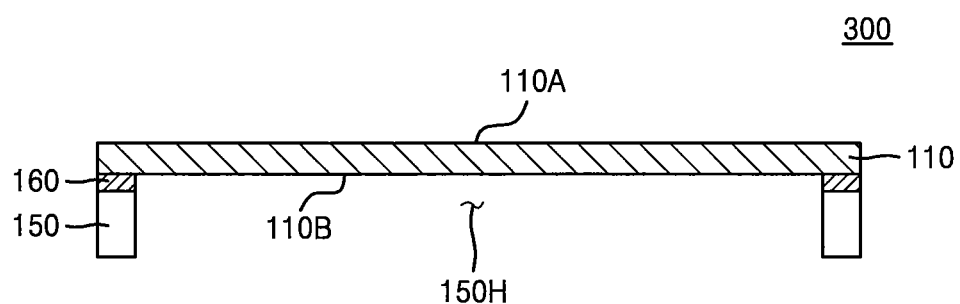

Referring to FIG. 8E, the sublimable support layer 320 is removed from the resultant product of FIG. 8D to form a pellicle assembly 300 in a similar manner to that described for removal of the sublimable support layer 120 with reference to operation P16 of FIG. 1 and FIG. 2C.

Figure 9A:
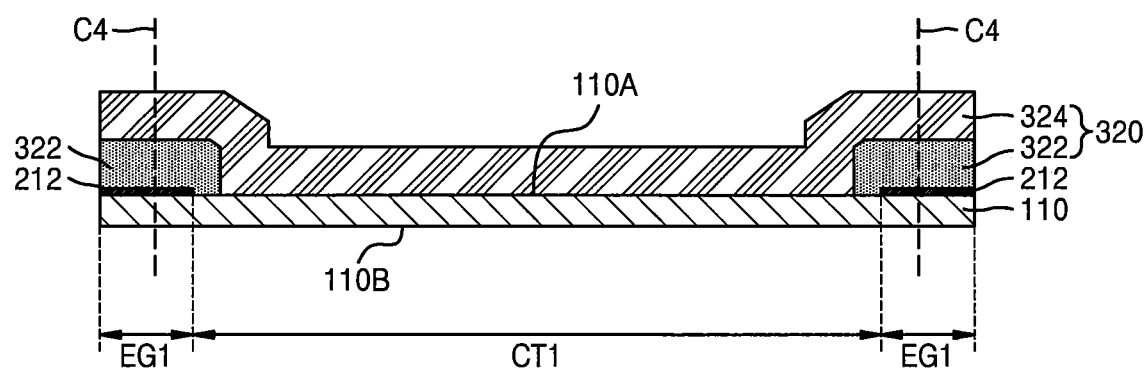
FIGS. 9A to 9C are cross-sectional views illustrating a method of manufacturing a pellicle assembly, according to some embodiments of the inventive concept.
Figure 9B:
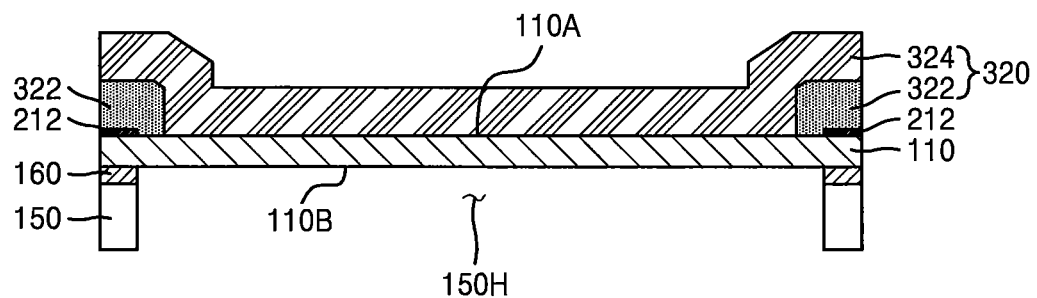
Figure 9C:
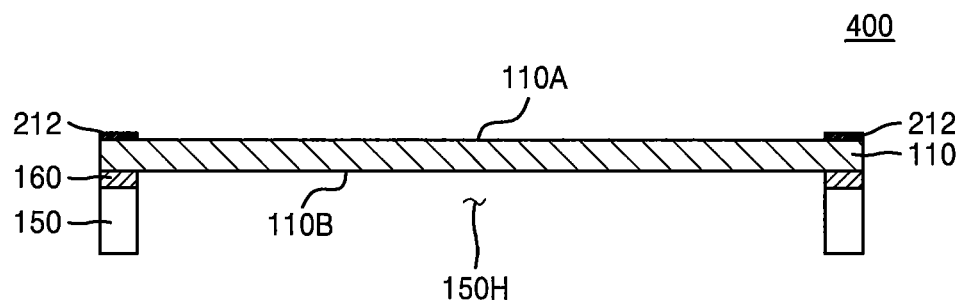

FIGS. 9A to 9C are cross-sectional views illustrating a method of manufacturing a pellicle assembly, according to some embodiments of the inventive concept, in a process sequence. In FIGS. 9A to 9C, the same reference numerals as in FIGS. 2A to 2C, FIGS. 7A to 7D, and FIGS. 8A to 8E denote the same elements, and descriptions thereof will not be given herein.

Referring to FIG. 9A, the polymer pattern 212 having viscoelasticity is formed on the edge region EG1, which is a local region selected from the first surface 110A of the pellicle membrane 110, in the same manner as described with reference to operation P22 of FIG. 6 and FIG. 7A.

Thereafter, the sublimable support layer 320 including the first sublimable support layer 322 and the second sublimable support layer 324 is formed on the first surface 110A of the pellicle membrane 110 in the same manner as described with reference to FIGS. 8A to 8C.

The polymer pattern 212 may serve as an adhesive layer between the pellicle membrane 110 and the sublimable support layer 320. Thus, during handling of the pellicle membrane 110 with the sublimable support layer 320 covering the first surface 110A, on the edge region EG1 where adhesion between the pellicle membrane 110 and the sublimable support layer 320 may be comparatively weak, the sublimable support layer 320 may be kept fixed on the pellicle membrane 110 by the polymer pattern 212 without being peeled off.

Referring to FIG. 9B, after cutting a resultant product of FIG. 9A along a cutting line C4, the pellicle frame 150 is attached to the second surface 110B of the pellicle membrane 110 in a similar manner to that described with reference to operation P14 of FIG. 1 and FIG. 2B. In some embodiments, the process of cutting the resultant product of FIG. 9A along the cutting line C4 may be omitted.

Referring to FIG. 9C, the sublimable support layer 320 is removed from the resultant product of FIG. 9B by sublimating the sublimable support layer 320 from the pellicle membrane 110 to form the pellicle assembly 400, in a similar manner to that described for removal of the sublimable support layer 120 with reference to operation P16 of FIG. 1 and FIG. 2C.

In the pellicle assembly 400, the first surface 110A of the pellicle membrane 110 may be exposed at a portion of the pellicle membrane 110 that overlaps with the opening 150I1 of the pellicle frame 150 in the thickness direction of the pellicle membrane 110. The first surface 110A may be covered with the polymer pattern 212 in the edge region EG1 (see FIG. 9A) of the pellicle membrane 110. The polymer pattern 212 may be removed from the pellicle assembly 400, or the polymer pattern 212 may be left on the pellicle assembly 400 as needed.

FIGS. 10A to 10D are cross-sectional views illustrating a method of manufacturing a pellicle assembly, according to some embodiments of the inventive concept, in a process sequence.

Referring to FIG. 10A, after forming the metal-containing thin film 514 on the support substrate 512, the pellicle membrane 110 is formed on the metal-containing thin film 514.

The support substrate 512 may be a substrate for supporting the metal-containing thin film 514. In some embodiments, the support substrate 512 may be a silicon substrate or a glass substrate. The metal-containing thin film 514 may be used as a catalyst in the process of forming the pellicle membrane 110. The metal-containing thin film 514 may include metal or metal nitride. In some embodiments, the metal-containing thin film 514 may include nickel (Ni), copper (Cu), chromium (Cr), ruthenium (Ru), platinum (Pt), cobalt (Co), titanium (Ti), tantalum (Ta), aluminum (Al), titanium nitride (TiN), tantalum nitride (TaN), an alloy thereof, or a combination thereof. In some embodiments, the support substrate 512 may be omitted.

A detailed structure of the pellicle membrane 110 is similar to that described with reference to FIG. 2A. The pellicle membrane 110 may have the edge region EG1 and the center region CT1 surrounded by the edge region EG1. In some embodiments, chemical vapor deposition (CVD), physical vapor deposition (PVD), atomic layer deposition (ALD), or molecular layer deposition (MLD) may be used to form the pellicle membrane 110, but the inventive concept is not limited thereto.

In some embodiments, a stack structure of the support substrate 512 and the metal-containing thin film 514 may be heat treated under an atmosphere containing hydrogen and hydrocarbon gas to form the pellicle membrane 110. The hydrocarbon gas may include $CH_4$ gas or $C_2H_2$ gas, but is not limited thereto. The heat treatment may be performed at a temperature of about 500° C. to about 1100° C., but is not limited thereto.

In some embodiments, after forming the pellicle membrane 110 on the metal-containing thin film 514, a further process of reducing a thickness of the pellicle membrane 110 may be performed. For example, in order to form a thin film sufficiently thin for EUV light or an electron beam having a wavelength of about 6.75 nm to about 13.5 nm to pass through, the thickness of the pellicle membrane 110 may be reduced in a state where the pellicle membrane 110 is formed on the metal-containing thin film 514. In order to reduce the thickness of the pellicle membrane 110, an etch process may be performed under a plasma etching atmosphere performed under an oxygen or hydrogen atmosphere to remove the pellicle membrane 110 from an upper surface of the pellicle membrane 110 by a certain thickness. In some embodiments, the process of reducing the thickness of the pellicle membrane 110 may be omitted and a subsequent process described later below with reference to FIG. 10B may be performed.

Figure 10B:
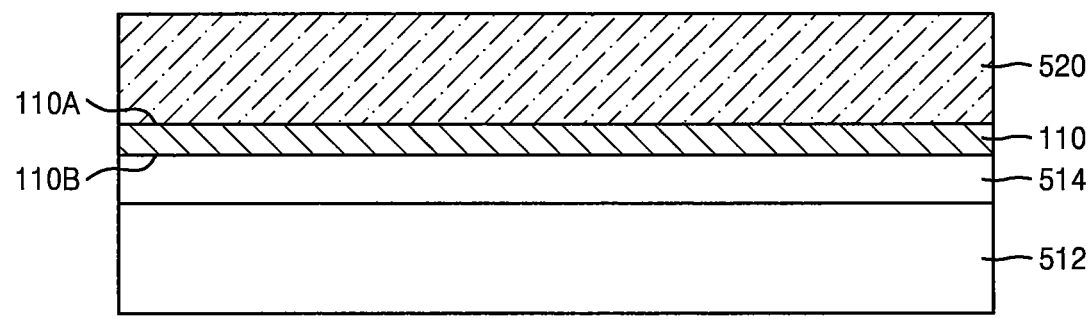

Referring to FIG. 10B, a sublimable support structure 520 is formed on the first surface 110A of the pellicle membrane 110.

In some embodiments, the sublimable support structure 520 may include the sublimable support layer 120 formed in the same manner as described with reference to FIG. 2A. In some embodiments, the sublimable support structure 520 may include the polymer pattern 212 and the sublimable support layer 220 formed in the same manner as described with reference to FIGS. 7A and 7B. In some embodiments, the sublimable support structure 520 may include the sublimable support layer 320 including the first sublimable support layer 322 and the second sublimable support layer 324 formed in the same manner as described with reference to FIGS. 8A to 8C. In some embodiments, the sublimable support structure 520 may include the polymer pattern 212 and the sublimable support layer 220 formed in the same manner as described with reference to FIG. 9A. However, according to the inventive concept, the sublimable support structure 520 is not limited to the above-described structures, and various modifications and changes may be made without departing from the scope of the inventive concept.

Figure 10C:
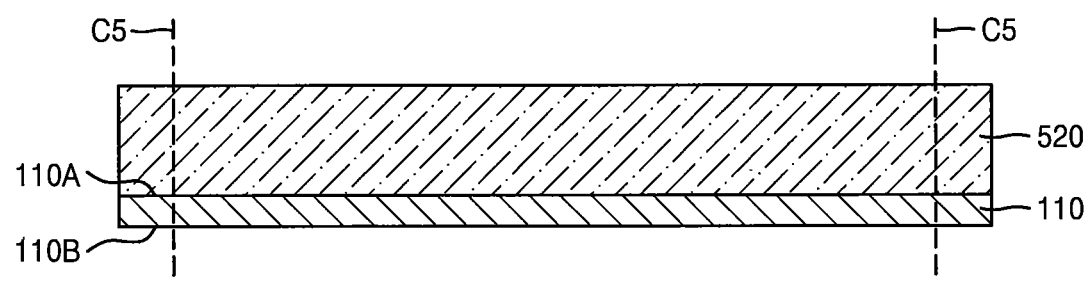

Referring to FIG. 10C, the support substrate 512 and the metal-containing thin film 514 are separated from the pellicle membrane 110 while the first surface 110A of the pellicle membrane 110 is covered with the sublimable support structure 520 to expose the second surface 110B of the pellicle membrane 110.

The metal-containing thin film 514 may be wet-etched to separate the support substrate 512 and the metal-containing thin film 514 from the pellicle membrane 110. In some embodiments, a resultant product of FIG. 10B, in which the first surface 110A of the pellicle membrane 110 is covered with the sublimable support structure 520, may be immersed in a bath containing an etchant and the metal-containing thin film 514 may be wet-etched. For example, the etchant may be, but is not limited to, an aqueous solution of $FeCl_3$ (iron III chloride), an aqueous solution of ammonium persulfate $((NH_4)_2S_2O_8)$ or an aqueous solution of ceric ammonium nitrate $((NH_4)_2Ce(NO_3)_6)$.

After the support substrate 512 and the metal-containing thin film 514 are separated from the pellicle membrane 110, a stack structure of the remaining pellicle membrane 110 and the sublimable support structure 520 is taken out from the bath, and metal impurities remaining on the stack structure are removed using an etching solution, and then an organic solvent such as acetone or deionized water (DIW) may be used to rinse. The etchant may include hydrochloric acid, nitric acid, sulfuric acid, acetic acid, hydrofluoric acid, aqua regia, or a combination thereof.

Figure 10D:
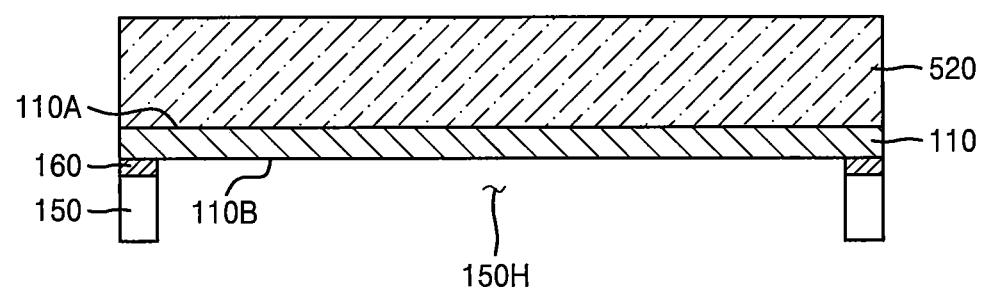

Referring to FIG. 10D, after cutting a stack structure of the pellicle membrane 110 and the sublimable support structure 520 along a cutting line C5 in a resultant product of FIG. 10C, the pellicle frame 150 is attached to the second surface 110B of the pellicle membrane 110 in a similar manner to that described with reference to operation P14 of FIG. 1 and FIG. 2B. In some embodiments, the process of cutting the stack structure of the pellicle membrane 110 and the sublimable support structure 520 along the cutting line C5 may be omitted.

Thereafter, a sublimable material is sublimated from the sublimable support structure 520 remaining in the resultant product of FIG. 10D in a similar manner to that described for removing the sublimable support layer 120 with reference to the processes P16 of FIG. 1 and FIG. 2C.

In some embodiments, when the sublimable support structure 520 includes the sublimable support layer 120 illustrated in. FIG. 2B, the pellicle assembly 100 illustrated in FIG. 2C may be obtained after the sublimable material is sublimated from the sublimable support structure 520 remaining in the resultant product of FIG. 10D. In some embodiments, when the sublimable support structure 520 includes the polymer pattern 212 and the sublimable support layer 220 illustrated in FIG. 7C, the pellicle assembly 200 illustrated in FIG. 7D may be obtained after the sublimable material is sublimated from the sublimable support structure 520 remaining in the resultant product of FIG. 10D. In some embodiments, when the sublimable support structure 520 includes the first sublimable support layer 322 and the second sublimable support layer 324 illustrated in FIG. 8D, the pellicle assembly 300 illustrated in FIG. 8E may be obtained after the sublimable material is sublimated from the sublimable support structure 520 remaining in the resultant product of FIG. 10D. In some embodiments, when the sublimable support structure 520 includes the polymer pattern 212 and the sublimable support layer 320 illustrated in FIG. 9A, the pellicle assembly 400 illustrated in FIG. 9C may be obtained after the sublimable material is sublimated from the sublimable support structure 520 remaining in the resultant product of FIG. 10D. In some embodiments, the polymer pattern 212 may be removed from the pellicle assemblies 200 and 400 illustrated in FIGS. 7D and 9C. In some embodiments, the polymer pattern 212 may not be removed and thus may be left in the pellicle assemblies 200 and 400 illustrated in FIGS. 7D and 9C.

According to the method of manufacturing the pellicle assembly described with reference to FIGS. 1 to 10D, when the pellicle membrane 110 is to be attached to the pellicle frame 150, the pellicle membrane 110 is handled using the relatively thick sublimable support layer 120, 220, and 320 of the order of tens to hundreds of micrometers or the sublimable support structure 520 including the sublimable support layer 120, 220, and 320 on the pellicle membrane 110, which is very thin in the order of tens of nanometers. Therefore, the handling of the pellicle membrane 110 may be easily performed until the pellicle membrane 110 is attached to the pellicle frame 150 after the pellicle membrane 110 is formed. In addition, in the process of attaching the pellicle membrane 110 to the pellicle frame 150, since the pellicle membrane 110 is handled using the sublimable support layers 120, 220, 320 or the sublimable support structures 520 having relatively rigid physical properties, external force due to the operation of an operator or a machine for handling the pellicle membrane 110 or surface tension of a solvent in contact with the pellicle membrane 110 does not directly affect the pellicle membrane 110. Accordingly, it is possible to reduce or possibly prevent deformation of the pellicle membrane 110 and to reduce or possibly prevent undesired deformation such as undesired bending or sagging in the pellicle membrane 110. Therefore, the pellicle membrane 110 may be attached to the pellicle frame 150 with excellent flatness.

Further, after the pellicle membrane 110 is attached to the pellicle frame 150, the sublimable support layers 120, 220, and 320 may be relatively easily and simply removed by sublimation. Also, external force applied to the pellicle membrane 110 by the sublimation while the sublimable support layers 120, 220, and 320 are sublimated is negligible, so that damage and stress to the pellicle membrane 110 may be minimized.

Figure 11:
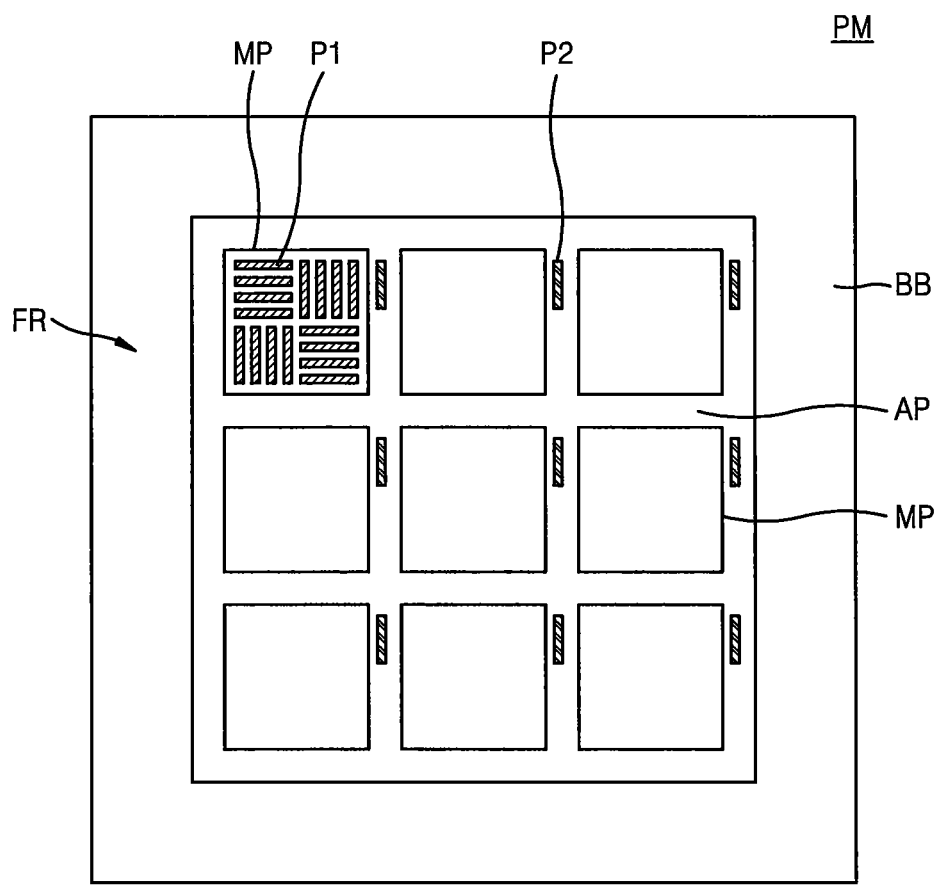
FIG. 11 is a plan view of a schematic structure of an example photomask that may be coupled to a pellicle assembly manufactured by a method of manufacturing the pellicle assembly according to some embodiments of the inventive concept.

FIG. 11 is a plan view of a schematic structure of an example photomask PM which may be coupled to a pellicle assembly manufactured by a method of manufacturing a pellicle assembly according to the inventive concept.

The photomask PM may be a reflective photomask for transferring a pattern onto a wafer (not shown) through an exposure process to manufacture an integrated circuit such as a semiconductor device. The photomask PM may be used in a photolithography process using an EUV wavelength range, for example, an exposure wavelength of about 13.5 nm.

A front surface FR of the photomask PM may include a main pattern area MP for transferring a main pattern necessary for forming a unit device constituting the integrated circuit in a chip area on the wafer, an auxiliary pattern area AP for transferring an auxiliary pattern to a scribe lane area on the wafer, and a black border area BB surrounding the main pattern area MP and the auxiliary pattern area AP. In the main pattern area MP, main pattern elements P1 constituting a main pattern for transferring a pattern necessary for forming the integrated circuit in the chip area on the wafer may be formed. In the auxiliary pattern area AP, an auxiliary pattern, which is necessary in the process of manufacturing the integrated circuit but does not remain in the final product of the integrated circuit, for example, auxiliary pattern elements P2 for transferring an align key pattern to the scribe lane area on the wafer, may be formed. The black border area BB may be a non-patterned area that does not include pattern elements for transferring patterns on the wafer.

Figure 12:
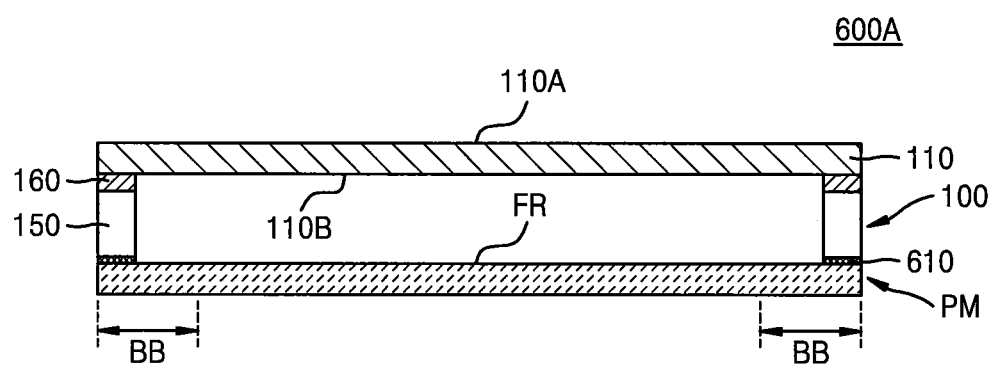
FIG. 12 is a cross-sectional view of a photomask assembly according to some embodiments of the inventive concept.

FIG. 12 is a cross-sectional view of a photomask assembly 600A according to some embodiments of the inventive concept.

Referring to FIG. 12, the photomask assembly 600A includes the photomask PM and the pellicle assembly 100 fixed on the black border area BB above the front side surface FR of the photomask PM.

In an example process for manufacturing the photomask assembly 600A, after the pellicle assembly 100 is manufactured in the same manner as described with reference to FIGS. 1 and 2A to 2C, the photomask PM may be fixed to the pellicle frame 150 such that the photomask PM faces the second surface 110B of the pellicle membrane 110 with the pellicle frame 150 therebetween. An adhesive layer 610 may be between the pellicle frame 150 and the black border area BB of the photomask PM to fix the pellicle assembly 100 to the photomask PM. The adhesive layer 610 may include a silicone resin, a fluorine resin, an acrylic resin, or a poly(styrene-ethylene-butadiene-styrene) resin, but is not limited thereto.

Figure 13:
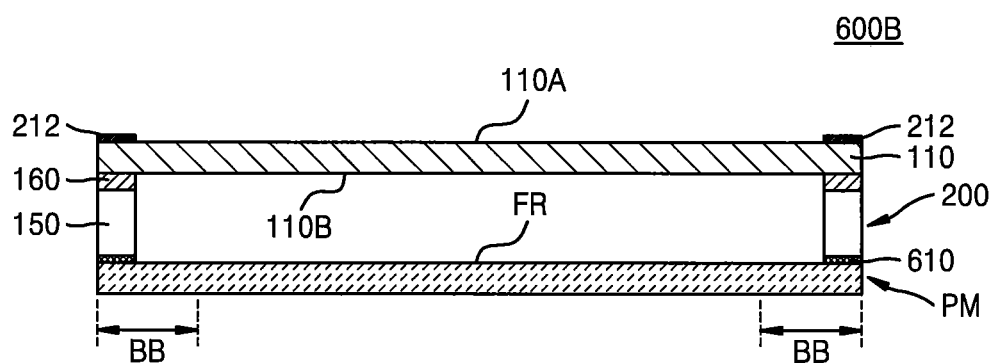
FIG. 13 is a cross-sectional view of a photomask assembly according to some embodiments of the inventive concept.

FIG. 13 is a cross-sectional view of a photomask assembly 600B according to some embodiments of the inventive concept. In FIG. 13, the same reference numerals as in FIG. 12 denote the same elements, and descriptions thereof will not be given herein.

Referring to FIG. 13, the photomask assembly 600B includes the photomask PM and the pellicle assembly 200 fixed on the black border area BB above the front side surface FR of the photomask PM.

In an example process for manufacturing the photomask assembly 600B, after the pellicle assembly 200 is manufactured in the same manner as described with reference to FIGS. 6 and 7A to 7D, the photomask PM may be fixed to the pellicle frame 150 such that the photomask PM faces the second surface 110B of the pellicle membrane 110 with the pellicle frame 150 therebetween. The adhesive layer 610 may be used to fix the pellicle assembly 200 to the photomask PM.

The photomask assemblies 600A and 600B illustrated in FIGS. 12 and 13 include the reflective photomask PM, but the inventive concept is not limited thereto. The photomask assemblies 600A and 600B may also include a photomask used in an exposure process using a transmissive photomask such as a KrF excimer laser (248 nm), an ArF excimer laser (193 nm), or a fluorine ($F_2$) excimer laser (157 nm) instead of the reflective photomask PM.

Figure 14:
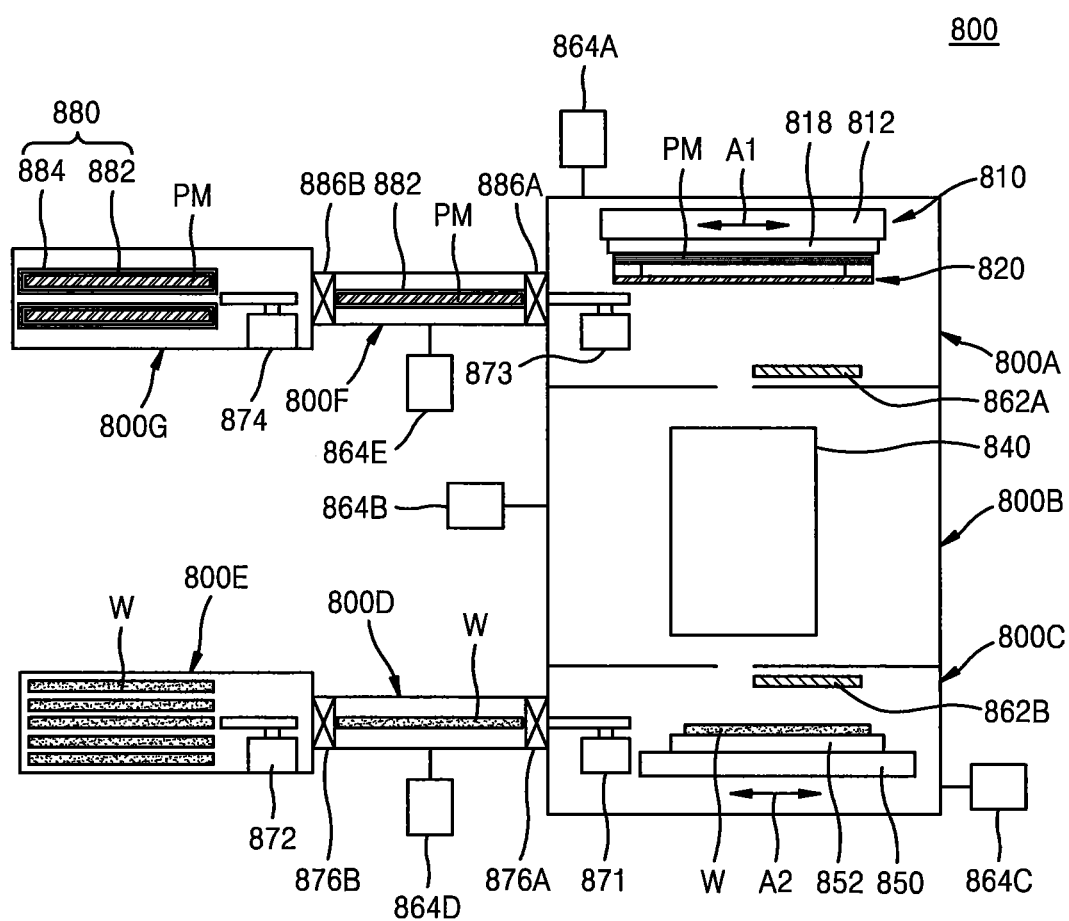
FIG. 14 is a cross-sectional view of a schematic configuration of an integrated circuit device manufacturing apparatus according to some embodiments of the inventive concept.

FIG. 14 is a cross-sectional view of a schematic configuration of an integrated circuit device manufacturing apparatus according to some embodiments of the inventive concept.

Referring to FIG. 14, an integrated circuit device manufacturing apparatus 800 may be an exposure apparatus that reduces an image of a pattern imaged on a photomask using EUV light in a projection optical system under vacuum and transfers the image to a wafer.

The integrated circuit device manufacturing apparatus 800 may include a mask stage region 800A, a projection optical system region 800B, and a wafer stage region 800C.

The mask stage 810 in the mask stage region 800A may include a mask stage support 812 and a mask holder system 818 fixed to the mask stage support 812. The mask holder system 818 may fix the photomask PM. The mask holder system 818 may be an electrostatic chuck and the mask holder system 818 may adsorb and hold the photomask PM by electrostatic force.

The pellicle assembly 820 may be fixed on the photomask PM. The pellicle assembly 820 may include the pellicle assemblies 100, 200, 300, and 400 illustrated in FIGS. 2C, 7D, 8E, and 9C, or a pellicle assembly having a variety of modified configurations therefrom. The mask stage 810 may move the photomask PM fixed to the mask stage support 812 in a scanning direction indicated by an arrow A1.

The projection optical system region 800B may be provided with a projection optical system 840 for transferring a pattern formed on the photomask PM to a wafer W in the wafer stage region 800C. The wafer W may be held fixed on a wafer chuck 852 on a wafer stage 850. The wafer chuck 852 may move the wafer W in a scanning direction indicated by the arrow A2.

The mask stage region 800A, the projection optical system region 800B, and the wafer stage region 800C may be separated by gate valves 862A and 862B, respectively. Vacuum exhaust devices 864A, 864B, and 864C are connected to the mask stage region 800A, the projection optical system region 800B, and the wafer stage region 800C, respectively, so that the pressure may be independently controlled.

A transfer hand 871 is provided for carrying the wafer W in or out between the wafer stage region 800C and a load lock chamber 800D and a vacuum exhaust device 864D may be connected to the load lock chamber 800D. The wafer W may be temporarily stored at atmospheric pressure in a wafer load port 800E. A transfer hand 872 may be provided to carry the wafer W in or out between the load lock chamber 800D and the wafer load port 800E. A gate valve 876A may be between the wafer stage region 800C and the load lock chamber 800D. A gate valve 876B may be between the load lock chamber 800D and the wafer load port 800E.

A transfer hand 873 may be provided for carrying in or out the photomask PM between the mask stage 810 of the mask stage region 800A and a mask load lock chamber 800F. A vacuum exhaust device 864E may be connected to the mask load lock chamber 800F. The photomask PM may be temporarily stored at atmospheric pressure in a mask load port 800G. A transfer hand 874 may be provided for carrying in or out the photomask PM between the mask load lock chamber 800F and the mask load port 800G. A gate valve 886A may be inserted between the mask stage region 800A and the mask load lock chamber 800F. A gate valve 886B may be inserted between the mask load lock chamber 800F and the mask load port 800G.

The photomask PM is stored and transported in a state accommodated in a photomask carrier 880 until the photomask PM is transported to the integrated circuit device manufacturing apparatus 800 from the outside and may be transported to the mask load port 800G while being accommodated in the photomask carrier 880. Thus, the photomask PM may be effectively protected from unnecessary contact with an external environment and external particle contamination. The photomask carrier 880 may include an inner pod 882 and an outer pod 884. The inner pod 882 and the outer pod 884 may protect the photomask PM when the photomask PM is transported.

The integrated circuit device manufacturing apparatus 800 may protect the photomask PM using the pellicle assemblies 100, 200, 300, and 400 manufactured by the methods according to some embodiments of the inventive concept. Even when the pellicle membrane 110 has a large area free-standing structure, in the process of manufacturing the pellicle assemblies 100, 200, 300, and 400, the pellicle membrane 110 is handled using any of the sublimable support layers 120, 220, and 320 illustrated in FIGS. 2A and 2B, FIGS. 7B and 7C, FIGS. 8C and 8D, and FIGS. 9A and 9B and the sublimable support structures 520 illustrated in FIGS. 10B to 10D. Accordingly, it may be possible to reduce or prevent undesired deformation such as undesired bending or sagging in the pellicle membrane 110. Therefore, it may be possible to effectively reduce or prevent an error caused by deterioration of a flatness of the pellicle membrane 110 during an exposure process, thereby effectively transferring a pattern of a desired shape to a correct position on a wafer.

Figure 15:
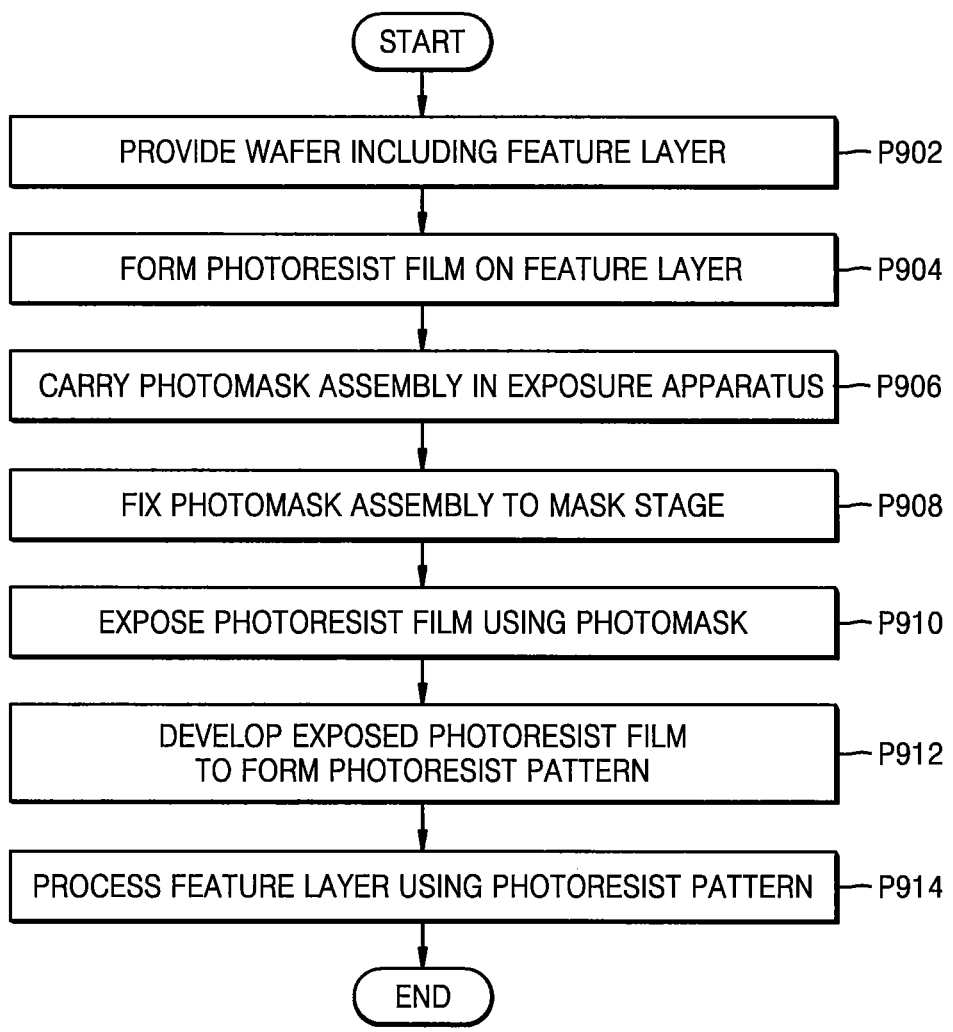
FIG. 15 is a flowchart illustrating a method of manufacturing an integrated circuit device according to some embodiments of the inventive concept.

FIG. 15 is a flowchart illustrating a method of manufacturing an integrated circuit device, according to some embodiments of the inventive concept.

Referring to FIG. 15, in operation P902, a wafer including a feature layer is provided. In some embodiments, the feature layer may be a conductive layer or an insulating layer formed on the wafer. The feature layer may include a metal, a semiconductor, or an insulating material. In some embodiments, the feature layer may be a portion of the wafer.

In operation P904, a photoresist film is formed on the feature layer. The photoresist film may include a resist for EUV light, $F_2$ excimer laser, ArF excimer laser, or KrF excimer laser.

In operation P906, the photomask assembly of the inventive concept is carried in an exposure apparatus. In some embodiments, the photomask assembly may be any of the photomask assemblies 600A and 600B described with reference to FIGS. 12 and 13 and various photomask assemblies modified therefrom. In some embodiments, the photomask assembly may be carried in the mask load port 800G of the integrated circuit device manufacturing apparatus 800 illustrated in FIG. 14.

In operation P908, the photomask assembly is fixed to the mask stage. In some embodiments, the mask stage may be the mask stage 810 of the integrated circuit device manufacturing apparatus 800 illustrated in FIG. 14.

In operation P910, the photoresist film on the wafer is exposed using a photomask. The exposure process may be performed using a reflective or transmissive exposure system.

In operation P912, the exposed photoresist film is developed to form a photoresist pattern.

In operation P914, the feature layer is processed using a photoresist pattern. In some embodiments, to process the feature layer according to operation P914, the feature layer may be etched using the photoresist pattern as an etch mask to form a feature pattern. In some embodiments, to process the feature layer according to operation P914, impurity ions may be implanted into the feature layer using the photoresist pattern as an ion implantation mask. In some embodiments, to process the feature layer according to operation P914, a separate process film may be formed on the feature layer exposed through the photoresist pattern formed in operation P912. The process film may be a conductive film, an insulating film, a semiconductor film, or a combination thereof.

According to a method of manufacturing an integrated circuit device, according to some embodiments of the inventive concept, since a photo mask assembly includes a flat pellicle membrane having no bending or sagging phenomenon, the occurrence of errors and defects due to flatness degradation of the pellicle membrane during an exposure process may be reduced or possibly prevented.

According to a method of manufacturing a pellicle assembly according to the inventive concept, by handling a pellicle membrane with a relatively rigid sublimable support layer or sublimable support structure formed on the pellicle membrane, external force may not directly affect the pellicle membrane during handling of the pellicle membrane. Accordingly, it may be possible to reduce or prevent deformation such as undesired bending or sagging of the pellicle membrane 110. Further, after the pellicle membrane is attached to the pellicle frame, the sublimable support layer may be relatively easily and simply removed. Also, damage and stress to the pellicle membrane may be reduced or minimized in the process of removing the sublimable support layer.

While the inventive concept has been particularly shown and described with reference to example embodiments thereof, it will be understood that various changes in form and details may be made therein without departing from the spirit and scope of the following claims.

What is claimed is:

1. A method of manufacturing a pellicle assembly, the method comprising:
   forming a sublimable support layer on a first surface of a pellicle membrane;
   attaching a pellicle frame to a second surface of the pellicle membrane while the sublimable support layer is on the first surface of the pellicle membrane, the second surface of the pellicle membrane being opposite to the first surface of the pellicle membrane; and
   sublimating the sublimable support layer while the pellicle frame is attached to the pellicle membrane to remove the sublimable support layer from the pellicle membrane.

2. The method of claim 1, wherein the sublimable support layer comprises a hydrocarbon compound.

3. The method of claim 1, wherein the sublimable support layer comprises an inorganic material.

4. The method of claim 1, wherein forming the sublimable support layer comprises supplying a gaseous sublimable material onto the first surface of the pellicle membrane.

5. The method of claim 1, wherein forming the sublimable support layer comprises coating a liquid sublimable material onto the first surface of the pellicle membrane.

6. The method of claim 1, further comprising forming a polymer layer having viscoelasticity on a portion of the first surface of the pellicle membrane prior to forming the sublimable support layer,
   wherein forming the sublimable support layer comprises forming the sublimable support layer on the first surface of the pellicle membrane and on the polymer layer, and the polymer layer is between the sublimable support layer and the pellicle membrane.

7. The method of claim 1, wherein forming the sublimable support layer comprises forming the sublimable support layer to have a first thickness on a center region of the pellicle membrane and a second thickness that is greater than the first thickness on an edge region of the pellicle membrane surrounding the center region of the pellicle membrane.

8. The method of claim 1, wherein forming the sublimable support layer comprises:
forming a first sublimable support layer on a first portion of the first surface of the pellicle membrane; and
forming a second sublimable support layer on a second portion of the first surface of the pellicle membrane and on the first sublimable support layer, wherein the first portion of the first surface of the pellicle membrane is different from the second portion of the first surface of the pellicle membrane, and the first sublimable support layer is between the pellicle membrane and the second sublimable support layer.

9. The method of claim 8, wherein a first density of the first sublimable support layer is greater than a second density of the second sublimable support layer.

10. The method of claim 1, wherein a metal-containing thin film is on the second surface of the pellicle membrane while forming the sublimable support layer on the first surface of the pellicle membrane, and
wherein the method further comprises removing the metal-containing thin film from the pellicle membrane to expose the second surface of the pellicle membrane after forming the sublimable support layer and before attaching the pellicle frame to the second surface of the pellicle membrane.

11. The method of claim 1, wherein removing the sublimable support layer comprises sublimating the sublimable support layer at room temperature and atmospheric pressure.

12. The method of claim 1, wherein removing the sublimable support layer comprises sublimating the sublimable support layer under an alcohol atmosphere.

13. A method of manufacturing a pellicle assembly, the method comprising:
forming a pellicle membrane on a metal-containing thin film, the pellicle membrane comprising a first surface and a second surface that is opposite to the first surface and comprising an edge portion and a center portion surrounded by the edge portion;
forming a sublimable support layer on the first surface of the pellicle membrane, the sublimable support layer having a first thickness on the edge portion of the pellicle membrane and a second thickness on the center portion of the pellicle membrane, and the first thickness being different from the second thickness;
removing the metal-containing thin film from the pellicle membrane;
attaching a pellicle frame to the second surface of the edge portion of the pellicle membrane; and
sublimating the sublimable support layer while the pellicle frame is attached to the pellicle membrane.

14. The method of claim 13, wherein forming the sublimable support layer comprises:
forming a first sublimable support layer on the first surface of the edge portion of the pellicle membrane, wherein the first sublimable support layer exposes the first surface of the center portion of the pellicle membrane; and
forming a second sublimable support layer on the first surface of the center portion of the pellicle membrane and on the first sublimable support layer, wherein the first sublimable support layer is between the pellicle membrane and the second sublimable support layer.

15. The method of claim 14, wherein forming the first sublimable support layer is performed at a first pressure, and
wherein forming the second sublimable support layer is performed at a second pressure that is higher than the first pressure.

16. The method of claim 14, wherein forming the first sublimable support layer comprises:
forming a mask layer on the first surface of the center portion of the pellicle membrane, the mask layer exposing the first surface of the edge portion of the pellicle membrane;
forming a preliminary first sublimable support layer on the mask layer and on the first surface of the edge portion of the pellicle membrane; and
forming the first sublimable support layer by removing the mask layer and a portion of the preliminary first sublimable support layer formed on the mask layer.

17. The method of claim 14, wherein the first sublimable support layer has a first density that is higher than a second density of the second sublimable support layer.

18. The method of claim 13, further comprising forming a polymer layer having viscoelasticity on the first surface of the pellicle membrane prior to forming the sublimable support layer,
wherein forming the sublimable support layer comprises forming the sublimable support layer on the first surface of the pellicle membrane and on the polymer layer, and the polymer layer is between the pellicle membrane and the sublimable support layer.

19. A method of manufacturing a photomask assembly, the method comprising:
forming a sublimable support structure comprising a sublimable material on a first surface of a pellicle membrane;
attaching a pellicle frame onto a second surface of the pellicle membrane while the sublimable support structure is on the first surface of the pellicle membrane, the second surface of the pellicle membrane being opposite to the first surface of the pellicle membrane;
sublimating the sublimable material from the sublimable support structure to expose the first surface of the pellicle membrane; and
fixing a photomask to the pellicle frame, the photomask facing the pellicle membrane, and the pellicle frame being between the photomask and the pellicle membrane.

20. The method of claim 19, wherein the pellicle membrane comprises a center portion and an edge portion surrounding the center portion,
wherein the method further comprises forming a polymer layer having viscoelasticity on the first surface of the edge portion of the pellicle membrane, and
wherein forming the sublimable support structure comprises forming the sublimable support structure on the center portion of the first surface of the pellicle membrane and on the polymer layer, and the polymer layer is between the pellicle membrane and the sublimable support structure.

* * * * *